(12) United States Patent
Sato et al.

(10) Patent No.: US 10,707,178 B2
(45) Date of Patent: Jul. 7, 2020

(54) WIRING SUBSTRATE

(71) Applicant: SHINKO ELECTRIC INDUSTRIES CO., LTD., Nagano (JP)

(72) Inventors: Junji Sato, Nagano (JP); Katsuya Fukase, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/423,370

(22) Filed: May 28, 2019

(65) Prior Publication Data

US 2019/0378804 A1 Dec. 12, 2019

(30) Foreign Application Priority Data

Jun. 7, 2018 (JP) ................................ 2018-109772

(51) Int. Cl.
*H05K 1/02* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............. H01L 23/562; H01L 23/49838; H01L 23/3128; H01L 21/4853; H01L 21/4857; H01L 21/565; H01L 21/568; H01L 21/6835; H01L 24/16; H01L 23/49822; H01L 23/49816; H01L 2924/3511; H01L 2224/16227; H01L 2221/68345; H05K 1/181; H05K 1/0271; H05K 2201/10378; H05K 2201/0909; H05K 2201/2009; H05K 3/0097; H05K 3/0052; H05K 3/4682; H05K 1/02; H05K 1/187; H05K 2201/068; H05K 3/007; H05K 2203/0147; H05K 2203/0156; H05K 2203/0152; H05K 2203/016; Y10T 29/49158

See application file for complete search history.

(56) References Cited

U.S. PATENT DOCUMENTS

| | | | | |
|---|---|---|---|---|
| 7,498,522 B2* | 3/2009 | Itoh | ...................... | H05K 1/0271 174/255 |
| 7,594,317 B2* | 9/2009 | Nakamura | ........... | H05K 3/0097 29/825 |
| 8,017,442 B2* | 9/2011 | Hsu | ..................... | H01L 21/4857 257/E21.214 |
| 9,820,391 B2* | 11/2017 | Shimizu | .................. | H01L 24/13 |

(Continued)

FOREIGN PATENT DOCUMENTS

JP     2017-084886     5/2017

*Primary Examiner* — Roshn K Varghese
(74) *Attorney, Agent, or Firm* — IPUSA, PLLC

(57) ABSTRACT

A wiring substrate includes: a wiring member that includes a first surface and a second surface, the wiring member including a plurality of wiring layers between the first surface and the second surface; and a carrier that is bonded to the first surface via an adhesive and that includes a plurality of layers whose coefficients of thermal expansion are different from each other. A pitch of wires included in the plurality of wiring layers is narrower on the second surface side than on the first surface side. When being heated, a direction in which the wiring member tends to warp and a direction in which the carrier tends to warp are opposite.

8 Claims, 25 Drawing Sheets

(51) Int. Cl.
  *H01L 23/498* (2006.01)
  *H01L 23/31* (2006.01)
  *H01L 21/683* (2006.01)
  *H01L 21/48* (2006.01)
  *H01L 21/56* (2006.01)
  *H05K 1/18* (2006.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/49822* (2013.01); *H01L 23/49838* (2013.01); *H01L 24/16* (2013.01); *H05K 1/02* (2013.01); *H05K 1/0271* (2013.01); *H05K 1/181* (2013.01); *H01L 2221/68345* (2013.01); *H01L 2224/16227* (2013.01); *H01L 2924/3511* (2013.01); *H05K 2201/068* (2013.01); *H05K 2201/10378* (2013.01)

(56) References Cited

U.S. PATENT DOCUMENTS

| | | | | |
|---|---|---|---|---|
| 2006/0192287 | A1* | 8/2006 | Ogawa | H01L 21/6835 257/758 |
| 2007/0124925 | A1* | 6/2007 | Nakamura | H01L 21/6835 29/830 |
| 2009/0242262 | A1* | 10/2009 | Asano | H05K 3/0064 174/267 |
| 2012/0018194 | A1* | 1/2012 | Maeda | H05K 3/0035 174/251 |
| 2013/0062108 | A1* | 3/2013 | Kondo | H05K 3/4069 174/258 |
| 2014/0268603 | A1* | 9/2014 | Hoffmeyer | G06F 17/5072 361/760 |
| 2015/0122530 | A1* | 5/2015 | Katsuda | H05K 3/4688 174/251 |
| 2015/0156877 | A1* | 6/2015 | Kang | H05K 3/0097 174/251 |
| 2016/0379937 | A1* | 12/2016 | Cho | H01L 23/562 174/261 |

* cited by examiner

200

300

1

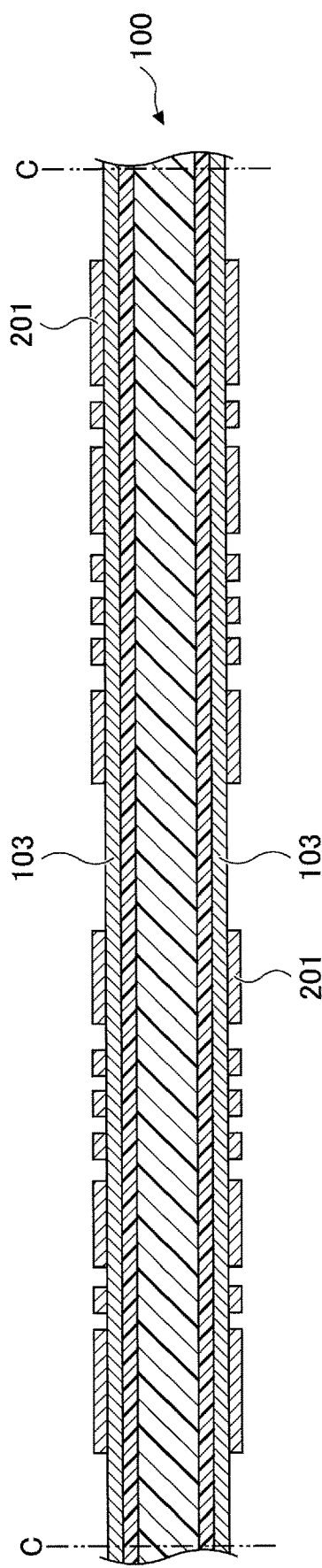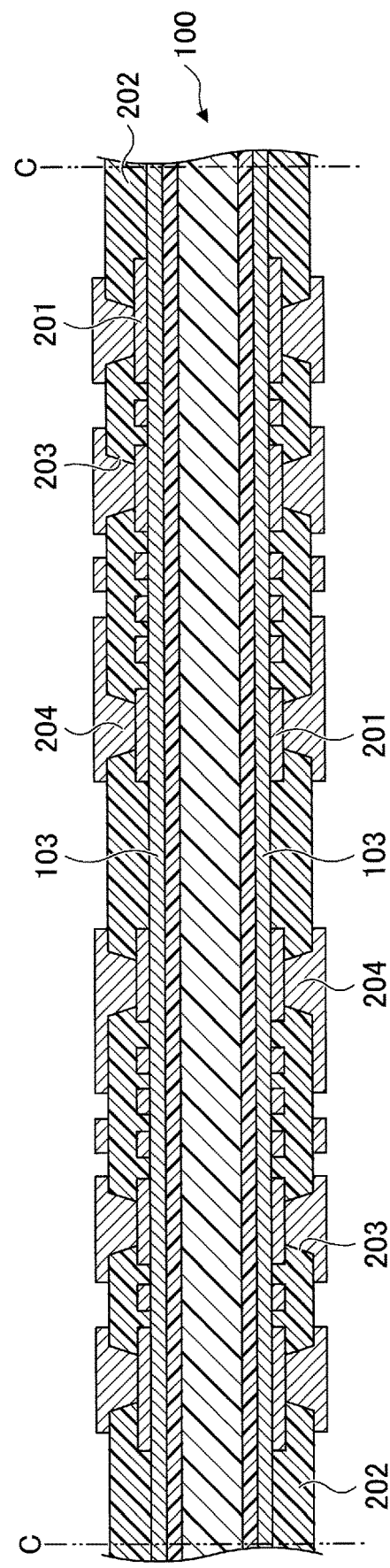

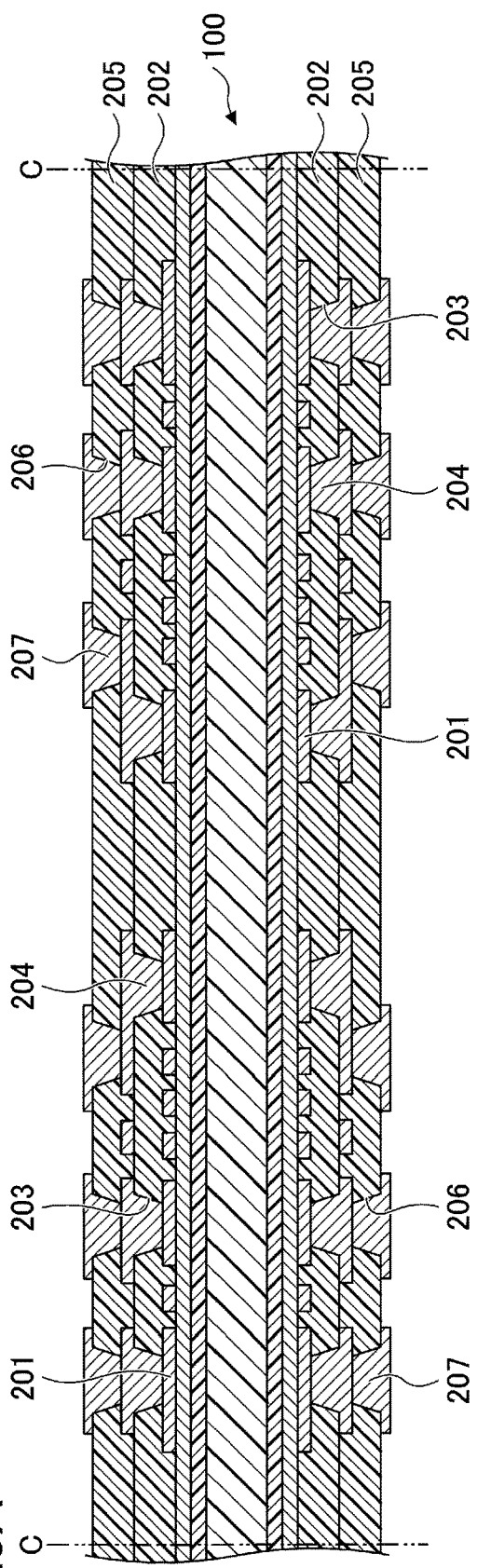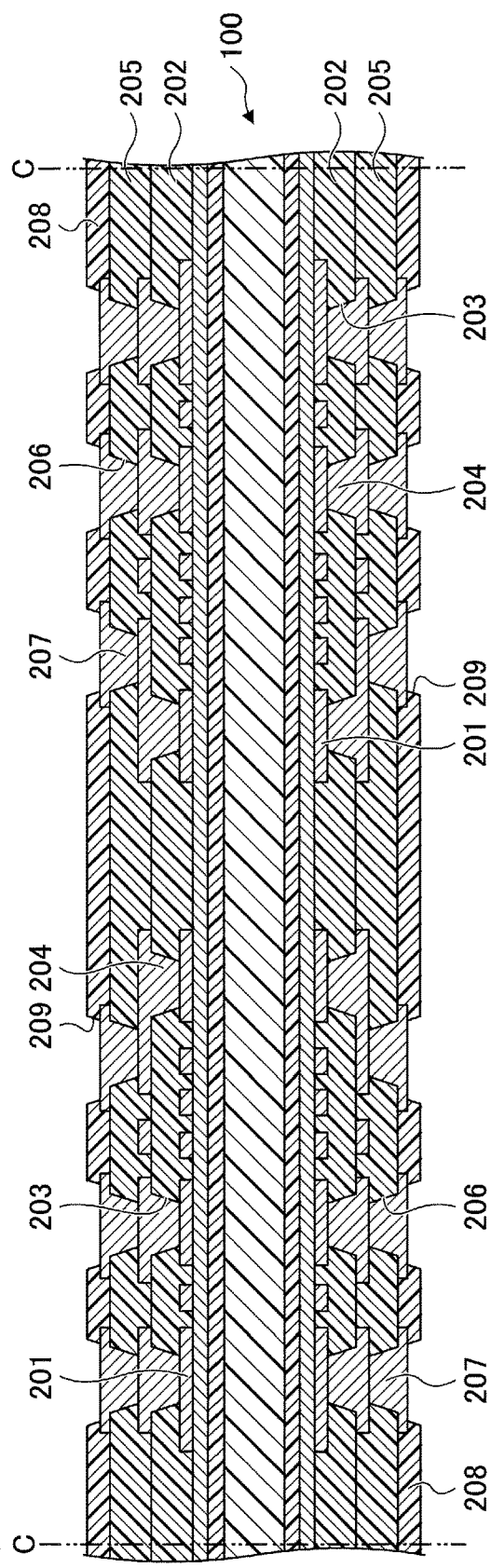

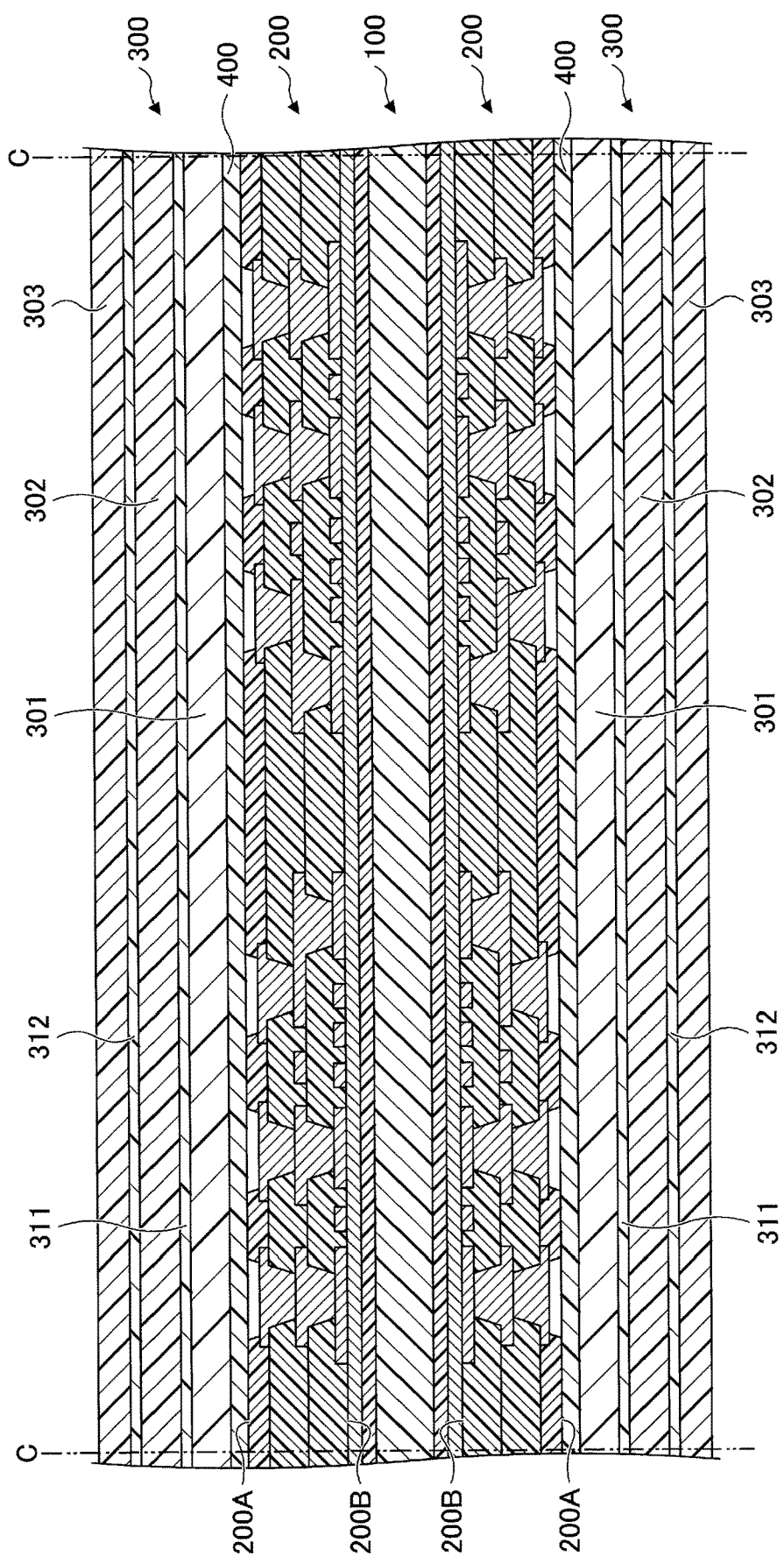

WIRING SUBSTRATE

CROSS-REFERENCE TO RELATED APPLICATION

This application is based upon and claims priority to Japanese Patent Application No. 2018-109772, filed on Jun. 7, 2018, the entire contents of which are incorporated herein by reference.

FIELD

The embodiments discussed herein relate to a wiring substrate.

BACKGROUND

As one type of wiring substrates used for semiconductor packages, coreless substrates that do not include core substrates are known. Coreless substrates are suitable for reducing the thickness of the wiring substrates. Conversely, because a coreless substrate more easily deflects than a wiring substrate including a core substrate and does not easily maintain its shape, the coreless substrate is not easily handled. Accordingly, a coreless substrate may be bonded to a stiff carrier and then a semiconductor chip may be mounted. Adhesion to the carrier enhances handling of the core substrate.

RELATED-ART DOCUMENTS

Patent Documents

[Patent Document 1] Japanese Laid-open Patent Publication No. 2017-84886

However, when a semiconductor chip is mounted, warpage may occur on a wiring substrate configured by adhering a coreless substrate to a carrier. Such warpage of a wiring substrate leads to a decrease in alignment accuracy with a semiconductor chip.

SUMMARY

According to one aspect, a wiring substrate includes: a wiring member that includes a first surface and a second surface, the wiring member including a plurality of wiring layers between the first surface and the second surface; and a carrier that is bonded to the first surface via an adhesive and that includes a plurality of layers whose coefficients of thermal expansion are different from each other. A pitch of wires included in the plurality of wiring layers is narrower on the second surface side than on the first surface side. When being heated, a direction in which the wiring member tends to warp and a direction in which the carrier tends to warp are opposite.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 8A and 8B are diagrams illustrating the method of manufacturing the wiring substrates according to the first embodiment (part 2);

FIGS. 9A and 9B are diagrams illustrating the method of manufacturing the wiring substrates according to the first embodiment (part 3);

FIG. 23 is a diagram illustrating a method of manufacturing wiring substrates according to the fourth embodiment (part 1);

DESCRIPTION OF EMBODIMENTS

The inventors of the present invention have conducted an earnest investigation to find the cause of warpage that occurs on a wiring substrate when mounting a semiconductor chip. Then, as a result of the detailed analysis by the inventors of the present invention, it has been found that a carrier itself does not easily warp even when the temperature changes during conveyance or reflow, and a wiring substrate including wiring layers and insulating layers cannot be sufficiently prevented from warping. That is, because of a high symmetry of the internal structure of the carrier, the carrier thermally expands or thermally shrinks simply isotropically but does not easily warp. Here, this new finding will be described with reference to a reference example.

Figure 1A:
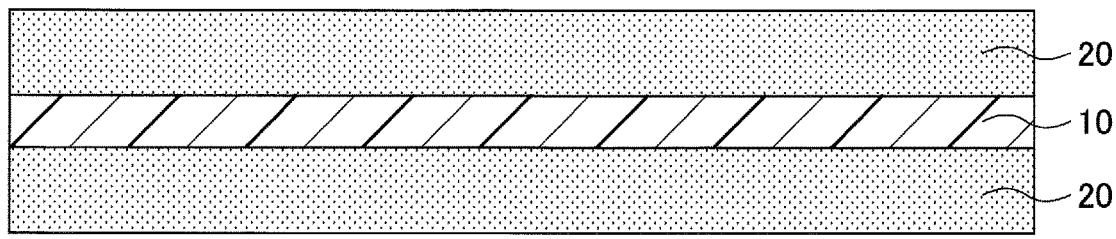
FIGS. 1A to 1C are cross-sectional views illustrating a reference example of a method of manufacturing wiring substrates.
Figure 1B:
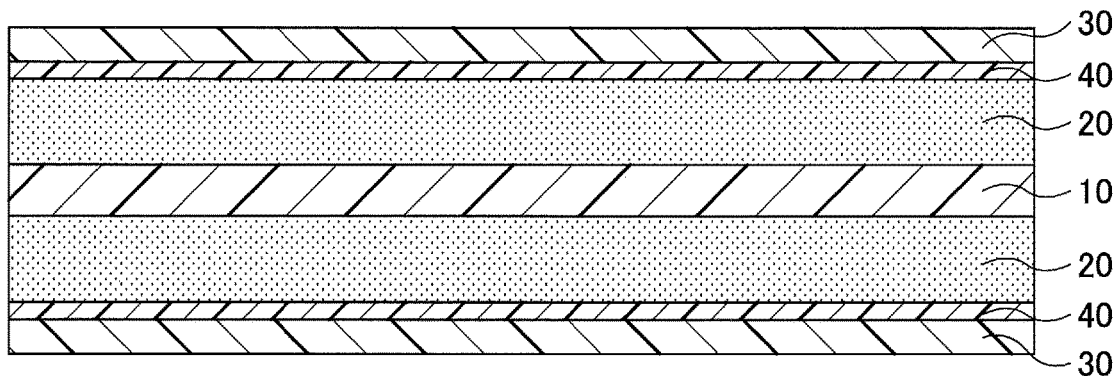
Figure 1C:
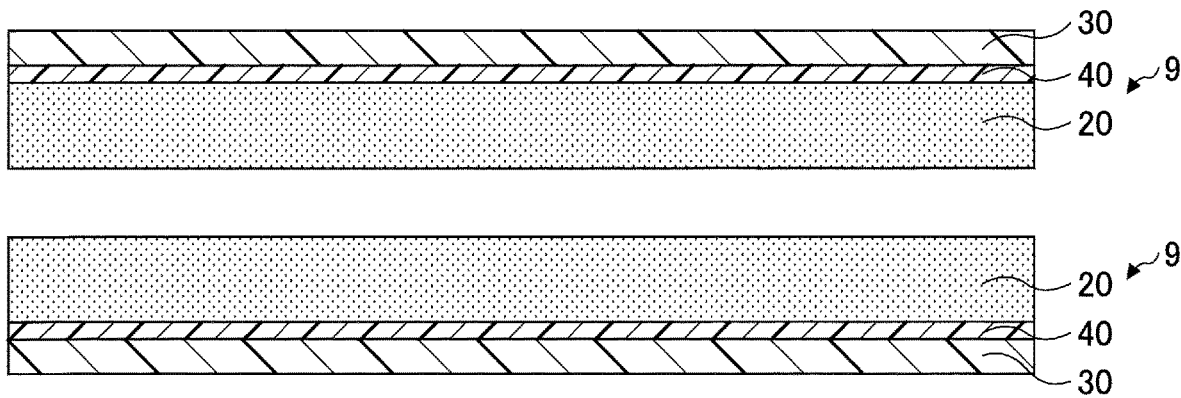
Figure 2A:
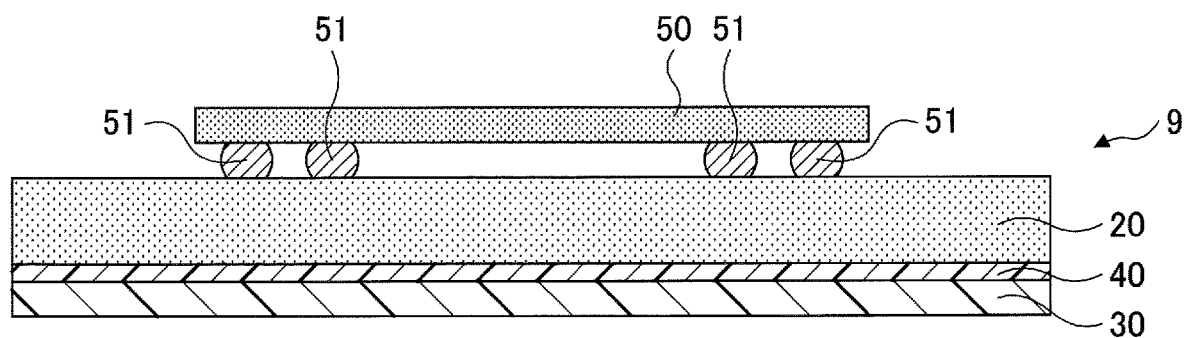
FIGS. 2A to 2C are cross-sectional views illustrating the reference example of a method of manufacturing a semiconductor package using a wiring substrate.
Figure 2B:
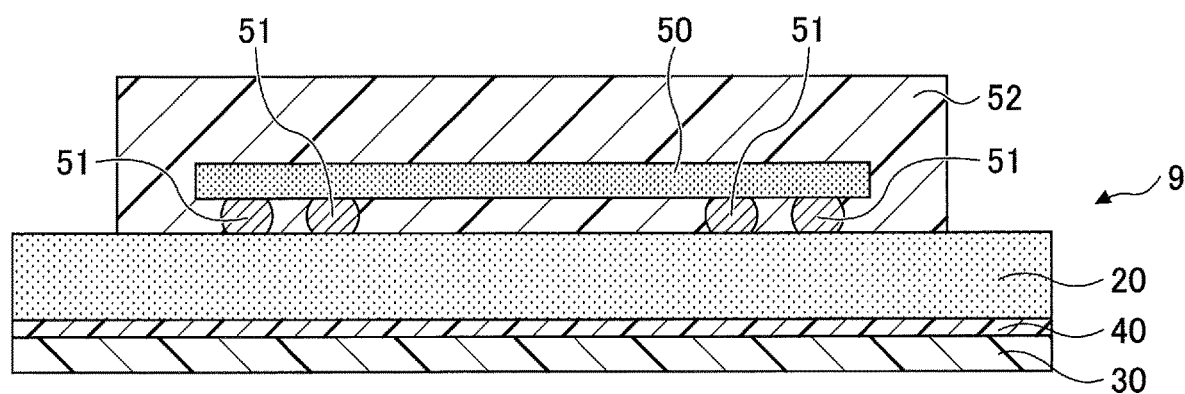
Figure 2C:
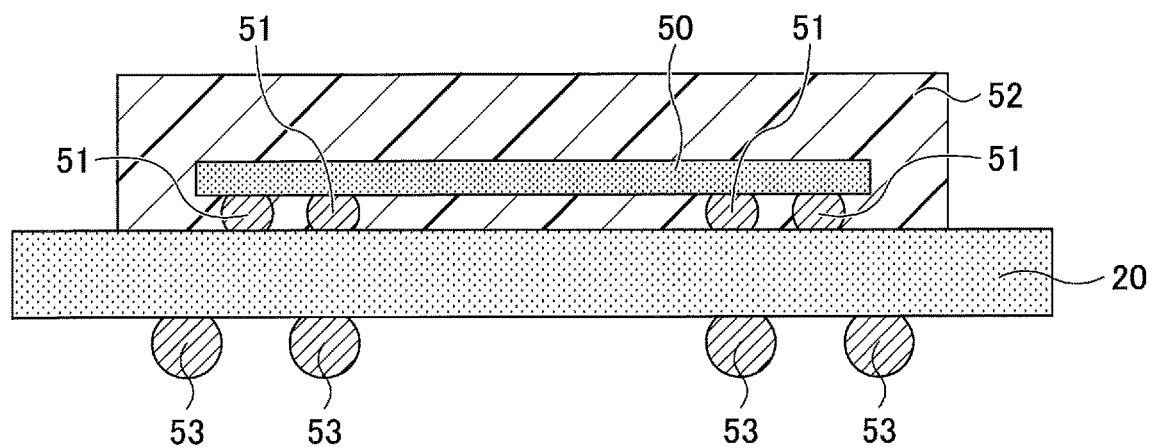

FIGS. 1A to 1C are cross-sectional views illustrating a reference example of a method of manufacturing wiring substrates. FIGS. 2A to 2C are cross-sectional views illustrating the reference example of a method of manufacturing a semiconductor package using a wiring substrate.

In this reference example, as illustrated in FIG. 1A, wiring members 20 are formed on both main surfaces of a support 10 by a build-up method. A plurality of wiring layers and insulating layers are included in the wiring members 20 but are not illustrated here. Then, carriers 30 are bonded to the wiring members 20 via adhesives 40, as illustrated in FIG. 1B. Thereafter, as illustrated in FIG. 1C, the wiring members 20 are separated from the support 10. In this manner, structures including the wiring members 20 and the carriers 30 are obtained. Then, by cutting such a structure into a plurality of pieces by a slicer or the like, a plurality of wiring substrates 9 are manufactured. Note that FIGS. 1A to 1C illustrate only an area that becomes the wiring substrates 9 after being cut.

In a case where a semiconductor package is manufactured using a wiring substrate 9, as illustrated in FIG. 2A, a semiconductor chip 50 is mounted on the wiring substrate 9 via bumps 51, and reflow is performed. Then, as illustrated in FIG. 2B, a resin sealing process using a thermosetting sealing resin 52 is performed. Thereafter, as illustrated in FIG. 2C, the carrier 30 and the adhesive 40 are peeled off to form bumps 53 on the surface opposite the surface of the wiring member 20 on which the semiconductor chip 50 is mounted.

In this manner, a semiconductor package can be manufactured.

Figure 3A:
FIGS. 3A to 3C are schematic vies illustrating an example of thermal deformation in the reference example.
Figure 3B:
Figure 3C:

In this reference example, as illustrated in FIG. 3A, the wiring member 20 is thermally defamed into a concave shape (downwardly protruding shape) during being heated, and, as illustrated in FIG. 3B, the carrier 30 is uniformly thermally expanded during being heated. In this case, the warpage of the wiring substrate 9 is smaller than the warpage of the wiring member 20 as illustrated in FIG. 3C, but is not eliminated. Accordingly, the wiring member 20 warps to a similar extent. In a case where the wiring member 20 is thermally deformed into a convex shape (upwardly protruding shape) during being heated, similarly, the warpage of the wiring substrate 9 and the wiring member 20 is not eliminated.

Focusing on the method of manufacturing a semiconductor package, the warpage of the wiring substrate 9 may be noticeable during reflow and a positional deviation may occur between the bumps 51 and the wiring member 20.

Also, due to the warpage of the wiring member 20, a wiring layer inside the wiring member 20 may be damaged or broken. Further, in a case where the wiring member 20 is conveyed at a high temperature before the semiconductor chip 50 is mounted, there is a possibility that, during being conveyed, the wiring member 20 warps, swings in a conveyance rack, and falls from the conveyance rack. Also, even in a case where the semiconductor chip 50 is properly mounted, the appearance may be poor due to the warpage.

Although it is considered to use a thick carrier in order to suppress the warpage of the wiring member 20, the use of a thick carrier may significantly increase a cost. In addition, the stiffness of the carrier itself may be excessively high, and deformation of the wiring member may occur when the carrier is peeled off.

At least, these phenomena have not been elucidated with respect to a wiring substrate on which a carrier is bonded to the opposite side from a wiring member with respect to a support, and no measures for these have been taken. In such a situation, as a result of earnest investigation by the inventors of the present invention, it was found that the use of a carrier with an appropriate coefficient of thermal expansion in accordance with a manner of thermal deformation of a wiring member can sufficiently suppress warpage of a wiring substrate when mounting a semiconductor chip.

The following embodiments based on these new findings of the inventors of the present invention will be described. In the following, the embodiments will be described with reference to the accompanying drawings. Note that in the specification and the drawings, substantially same constituent elements may be referred to by the same reference numerals, and duplicate descriptions may be omitted as appropriate.

First Embodiment

A first embodiment will be described. The first embodiment relates to a wiring substrate.

[Structure of Wiring Substrate]

Figure 4:
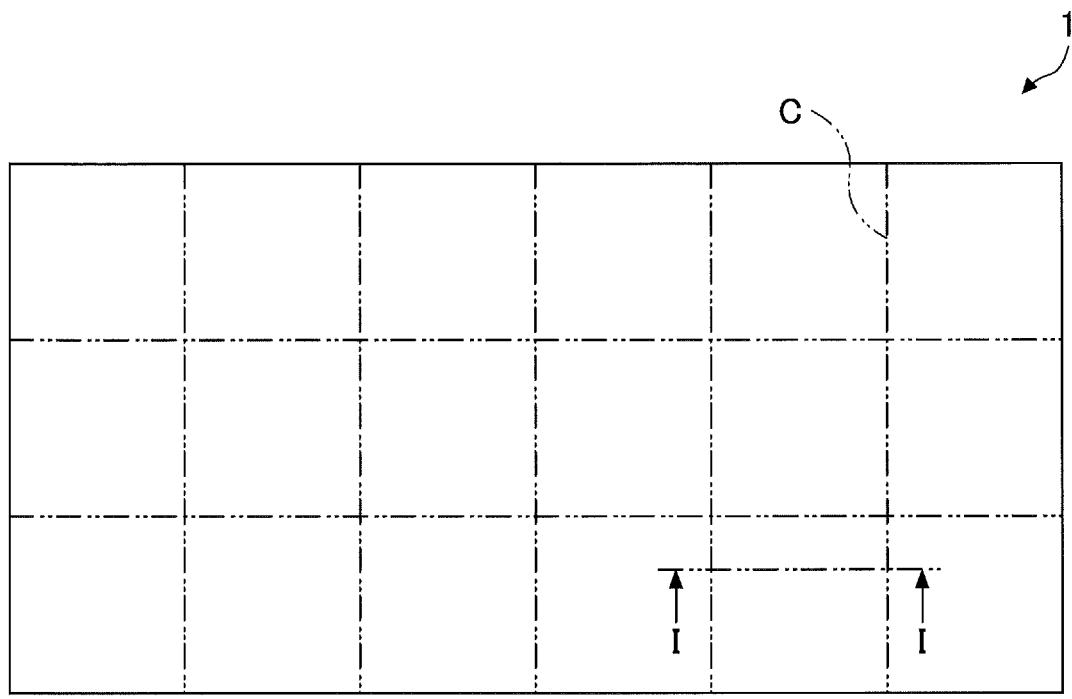
FIG. 4 is a plan view illustrating a structure of a wiring substrate according to a first embodiment.
Figure 5:
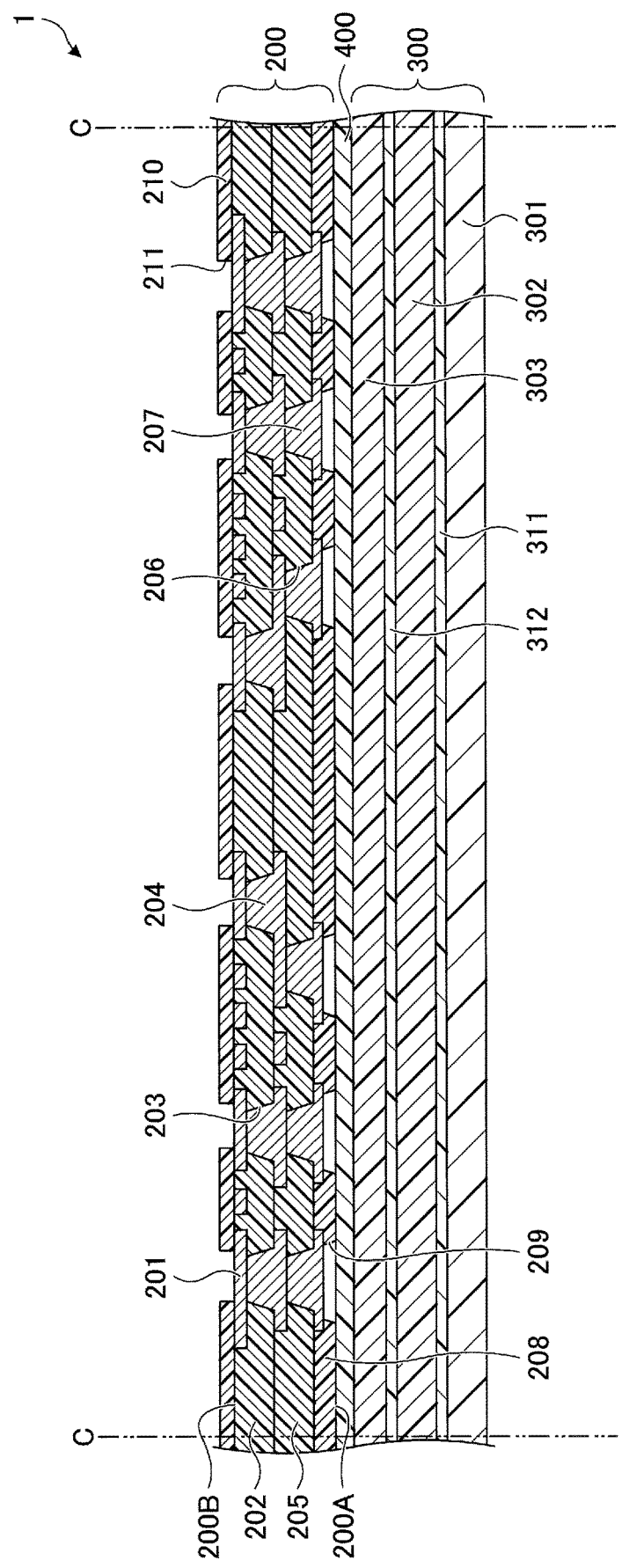
FIG. 5 is a cross-sectional view illustrating the structure of the wiring substrate according to the first embodiment.

First, a structure of a wiring substrate 1 will be described. FIG. 4 is a plan view illustrating the structure of the wiring substrate 1 according to the first embodiment, and FIG. 5 is a cross-sectional view illustrating the structure of the wiring substrate 1 according to the first embodiment. FIG. 5 corresponds to a cross-sectional view taken along the line I-I in FIG. 4.

As illustrated in FIG. 4, the wiring substrate 1 according to the first embodiment is a sheet-shaped wiring substrate having a plurality of areas surrounded by double-dot chain lines C. The wiring substrate 1 is subjected to processes such as mounting semiconductor chips and forming sealing resins. Then, the support is removed. Finally, the wiring substrate 1 is cut along the double-dot chain lines C to be a plurality of separated semiconductor packages. Note that in the example illustrated in FIG. 4, the wiring substrate 1 has eighteen areas surrounded by the double-dot chain lines C, but the number of areas is not limited to eighteen.

As illustrated in FIG. 5, the wiring substrate 1 includes a wiring member 200 and a carrier 300. The wiring member 200 includes a first surface 200A and a second surface 200B, and the carrier 300 is bonded to the first surface 200A via an adhesive 400.

The wiring member 200 includes a wiring layer 201, an insulating layer 202, a wiring layer 204, an insulating layer 205, and a wiring layer 207. The wiring layer 204 is located between the wiring layer 201 and the wiring layer 207, the wiring layer 201 is located on the second surface 200B side of the wiring layer 204, and the wiring layer 207 is located on the first surface 200A side of the wiring layer 204. Via holes 203 are formed on the insulating layer 202 and parts of the wiring layer 204 are connected to the wiring layer 201 through the via holes 203. Also, via holes 206 are formed on the insulating layer 205 and parts of the wiring layer 207 are connected to the wiring layer 204 through the via holes 206. The pitch of wires included in the wiring layer 201 is narrower than the pitch of wires included in the wiring layer 204, and the pitch of wires included in the wiring layer 204 is narrower than the pitch of wires included in the wiring layer 207.

For example, copper (Cu) or a copper alloy can be used as a material of the wiring layers 201, 204, and 207. As a material of the insulating layers 202 and 205, for example, an insulating resin such as an epoxy resin or a polyimide resin, or a resin material obtained by mixing a filler such as silica or alumina into such an insulating resin can be used. Also, as a material of the insulating layers 202 and 205, for example, an insulating resin including a reinforced material obtained by impregnating the reinforced material such as a woven fabric such as glass, aramid, or a Liquid Crystal Polymer (LCP) fiber or a non-woven fabric with a thermosetting resin mainly composed of an epoxy resin or a polyimide resin may be used. Note that an insulating resin having a thermosetting property or an insulating resin having a photosensitive property can be used as a material of the insulating layers 202 and 205.

The second surface 200B side of the insulating layer 202 is covered by a solder resist layer 210, and opening portions 211, which expose parts of the wiring layer 201, are formed on the solder resist layer 210. The first surface 200A side of the insulating layer 205 is covered by a solder resist layer 208, and opening portions 209, which expose parts of the wiring layer 207, are formed on the solder resist layer 208.

As a material of the solder resist layers 208 and 210, for example, a photosensitive dry film resist or a liquid photoresist (for example, a dry film resist such as an novolac resin or an acrylic resin or a liquid resist) is used. Note that the solder resist layer 210 may not be formed.

In the present embodiment, when the wiring member 200 is heated, the second surface 200B is thermally expanded larger than the first surface 200A. That is, by being heated, the wiring member 200 is thermally deformed into a convex shape on the carrier 300. The manner of thermal deformation of the wiring member 200 depends on the materials and the thicknesses of the wiring layers 201, 204 and 207, and the materials and the thicknesses of the insulating layers 202 and 205, and the like.

The carrier 300 includes a first layer 301, a second layer 302 above the first layer 301, and a third layer 303 above the second layer 302. The first layer 301 and the second layer 302 are bonded to each other by an adhesive 311, and the second layer 302 and the third layer 303 are bonded to each other by an adhesive 312. The coefficient of thermal expansion of the second layer 302 is lower than the coefficient of thermal expansion of the first layer 301, and the coefficient of thermal expansion of the third layer 303 is lower than the coefficient of thermal expansion of the second layer 302. For example, the coefficient of thermal expansion of the first layer 301 is in a range of from 24 ppm/° C. to 29 ppm/° C., the coefficient of thermal expansion of the second layer 302 is in a range of from 20 ppm/° C. to 23 ppm/° C., and the coefficient of thermal expansion of the third layer 303 is in a range of from 15 ppm/° C. to 19 ppm/° C.

For example, a polyimide film can be used as the first layer 301, the second layer 302, and the third layer 303.

Also, as the first layer 301, the second layer 302, and the third layer 303, a copper plate or copper foil may be used, and an aluminum plate or aluminum foil may be used. As a material of the adhesives 311 and 312, for example, a material whose adhesion is decreased by ultraviolet radiation can be used. Also, as a material of the adhesives 311 and 312, for example, an adhesive that hardens at an ambient temperature or a cold temperature or a thermosetting adhesive can be used.

In the wiring substrate 1, the third layer 303 is bonded to the first surface 200A by an adhesive 400. As a material of the adhesive 400, for example, a material whose adhesion is decreased by ultraviolet radiation can be used. Also, as a material of the adhesive 400, for example, an adhesive that hardens at an ambient temperature or a cold temperature or a thermosetting adhesive can be used.

In a case where a material whose adhesion is decreased by ultraviolet radiation is used as each of the adhesive 311, the adhesive 312, and the adhesive 400, the sensitivity to ultraviolet light of the adhesive 312 may be lower for than that of the adhesive 311 and the sensitivity to ultraviolet light of the adhesive 400 may be lower than that of the adhesive 312. In other words, the adhesive 312 is less easily peeled off due to ultraviolet than the adhesive 311, and the adhesive 400 is less easily peeled off due to ultraviolet radiation than the adhesive 312.

Also, in a case where an adhesive that hardens at an ambient temperature or a cold temperature or a thermosetting adhesive is used as each of the adhesive 311, the adhesive 312, and the adhesive 400, the strength of adhesion of the adhesive 312 may be lower than that of the adhesive 400, and the strength of adhesion of the adhesive 311 may be lower than that of the adhesive 312. In other words, the adhesive 312 is less easily peeled off due to ultraviolet than the adhesive 311, and the adhesive 400 is less easily peeled off due to ultraviolet radiation than the adhesive 312.

In this manner, by changing the sensitivities and/or the strengths of the adhesive 311, the adhesive 312, and the adhesive 400 in a stepwise manner, the warpage of the carrier 300 with respect to the warpage of the wiring member 200 can be easily adjusted.

Figure 6A:
FIGS. 6A to 6C are schematic vies illustrating an example of thermal deformation of the wiring substrate according to the first embodiment.
Figure 6B:
Figure 6C:

Next, thermal deformation of the wiring substrate 1 according to the first embodiment will be described. FIGS. 6A to 6C are schematic views illustrating an example of thermal deformation of the wiring substrate 1 according to the first embodiment.

In the present embodiment, as illustrated in FIG. 6A, upon being heated, the wiring member 200 tends to be thermally deformed into a convex shape. With respect to the carrier 300, the thermal expansion coefficient of the second layer 302 is lower than the thermal expansion coefficient of the first layer 301, and the thermal expansion coefficient of the third layer 303 is lower than the thermal expansion coefficient of the second layer 302. Accordingly, as illustrated in FIG. 6B, upon being heated, the carrier 300 tends to be thermally deformed into a concave shape. That is, when being heated, the direction in which the wiring member 200 tends to warp and the direction in which the carrier 300 tends to warp are opposite. Also, the wiring member 200 is bonded to the carrier 300 by the adhesive 400. Therefore, thermal deformation of the wiring member 200 and thermal deformation of the carrier 300 are restrained each other, the warpage of the wiring member 200 and the warpage of the carrier 300 are canceled out each other, and the warpage of the wiring substrate 1 is significantly suppressed, as illustrated in FIG. 6C. Because the warpage of the wiring substrate 1 is suppressed, the warpage of the wiring member 200 is also suppressed.

In this manner, according to the present embodiment, the warpage of the wiring member 200 due to being heated can be remarkably suppressed. Accordingly, as will be described below, semiconductor chips can be precisely aligned during a process of manufacturing semiconductor packages. Also, it is possible to reduce or prevent conveyance failure and appearance failure due to warpage of the wiring substrate 1.

Also, in the present embodiment, the pitch of the wires included in the wiring layer 201 is narrower than the pitch of the wires included in the wiring layer 207. Accordingly, the present embodiment can be used to mount semiconductor chips having a narrow pitch of pads (external terminals).

Note that it is preferable that the stiffness of the first layer 301, the second layer 302, and the third layer 303 is lower than the stiffness of the wiring member 200. This is because if the stiffness of the first layer 301, the second layer 302, and the third layer 303 is excessively high, there is a possibility that the wiring member 200 is deformed when the carrier 300 is peeled off from the wiring member 200 in the manufacturing process of semiconductor packages.

[Method of Manufacturing Wiring Substrates]

Next, a method of manufacturing wiring substrates 1 will be described. FIGS. 7 to 12 are diagrams illustrating a method of manufacturing wiring substrates according to the first embodiment.

Figure 7A:
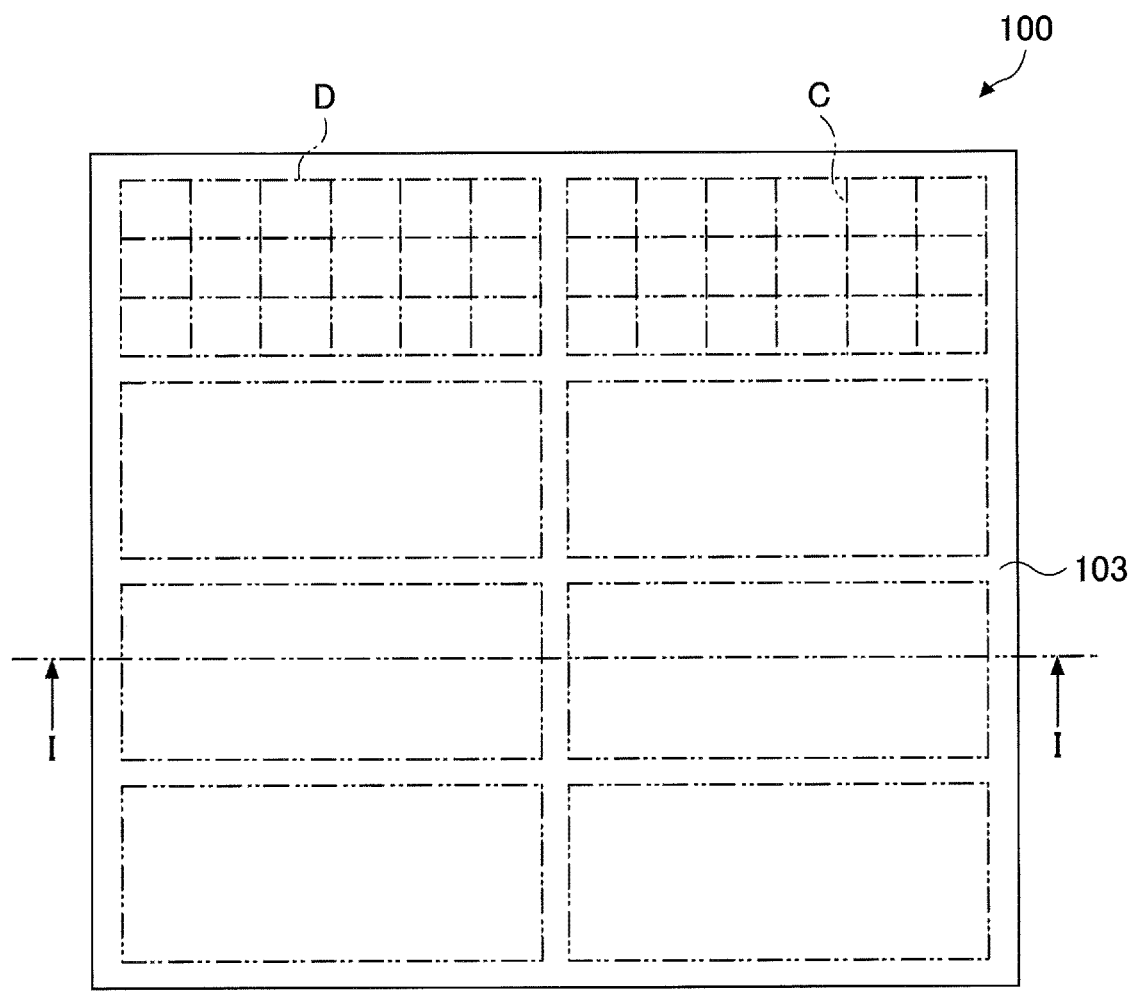
FIGS. 7A and 7B are diagrams illustrating a method of manufacturing wiring substrates according to the first embodiment (part 1)
Figure 7B:
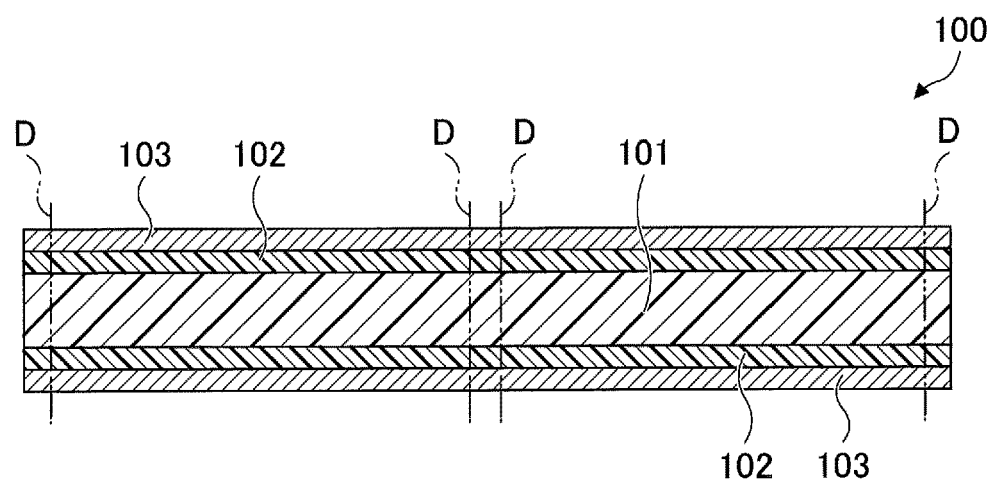

First, a support 100 is provided as illustrated in FIGS. 7A and 7B. FIG. 7A is a plan view, and FIG. 7B is a cross-sectional view taken along the line I-I in FIG. 7A. The support 100 includes a support substrate 101, adhesive layers 102, and metal layers 103. The adhesive layers 102 and the metal layers 103 are provided on both surfaces of the support substrate 101.

As the support substrate 101, for example, a material obtained by impregnating a woven fabric such as a glass fiber or an aramid fiber or a non-woven fabric (not illustrated) with an insulating resin such as an epoxy-based resin can be used. As the adhesion layers 102, for example, metal foil such as copper foil, aluminum foil, nickel foil, or zinc foil, a ceramic plate, a resin sheet mainly composed of an acrylic resin or a polyimide resin, or the like can be used. For example, copper foil or the like may be used as the metal layers 103.

In FIG. 7A, respective areas surrounded by the double-dot chain lines D indicate areas that becomes sheet-shaped wiring substrates 1. That is, the respective areas surrounded by the double-dot chain lines D are cut along the double-dot chain lines D to be the plurality of separated sheet-shaped wiring substrates 1 (see FIG. 4 and FIG. 5). The respective areas surrounded by the double-dot chain lines D are arranged inside areas with respect to the outer edge of the support 100 in a plan view. Note that although FIG. 7A illustrate eight areas surrounded by the double-dot chain lines D, the number of areas is not limited to eight.

Note that in the following, processes will be described with reference to a cross-sectional view of an area (corresponding to an area surrounded by the double-dot chain lines C in FIG. 4) to be a semiconductor package by being separated finally within an area to be one wiring substrate 1 surrounded by the double-dot chain lines D in FIG. 7A. Also, in the following description, the term "on" or "above" may refer to a direction away from the support 100 with respect to support 100.

After preparation of the support 100, the wiring layers 201 are formed on the metal layers 103 with respect to both sides of the support 100, as illustrated in FIG. 8A. The wiring layers 201 can be formed, for example, by a semi-active method. For example, resist layers having openings at desired locations are formed on the surfaces of the metal layers 103. The openings are formed so as to expose portions of the metal layers 103 corresponding to the wiring layers 201. As a material of the resist layers, a material such as a photosensitive dry film resist or a liquid photoresist (for example, a dry film resist such as an novolac resin or an acrylic resin or a liquid resist) can be used. Subsequently, using the resist layers as plating masks, to the surfaces of the metal layers 103, electrolytic plating (electrolytic copper plating) using the metal layers 103 as plating feeder layers is applied to form the wiring layers 201. The resist layers are then removed, for example, with an alkaline peeling liquid.

Then, as illustrated in FIG. 8B, the insulating layers 202 that cover the wiring layers 201 are formed on the metal layers 103 with respect to both sides of the support 100. In forming the insulating layers 202, for example, an uncured resin film is applied, heat treated, and cured. The insulating layers 202 are formed of an insulating resin such as, for example, an epoxy resin or a polyimide resin. The insulating layers 202 may be formed by applying a liquid resin.

Thereafter, with respect to both sides of the support 100, the via holes 203 that penetrate the insulating layers 202 and that expose parts of the wiring layers 201 are formed on the insulating layers 202. The via holes 203 can be foamed, for example, by laser processing using a $CO_2$ laser or the like. A desmear process may be performed as needed.

Subsequently, with respect to both sides of the support 100, the wiring layers 204, which are connected to the wiring layers 201 through the via holes 203, are formed on the insulating layers 202. The wiring layers 204 can be formed, for example, by a semi-active method. For example, first, seed layers are formed on the upper surfaces of the insulating layers 202 by an electroless plating method. Resist layers having opening portions at predetermined locations are formed on the seed layers. As a material of the resist layers, a material such as a photosensitive dry film resist or a liquid photoresist (for example, a dry film resist such as an novolac resin or an acrylic resin or a liquid resist) can be used. Subsequently, using the resist layers as plating masks, electrolytic plating (electrolytic copper plating) using the seed layers as plating feeder layers is applied to form electrolytic plating layers. Then, the resist layers are removed by an alkaline peeling liquid, and the unnecessary seed layers are removed using the electrolytic plating layers as etching masks. Thereby, the wiring layers 204 are formed.

After forming the wiring layers 204, as illustrated in FIG. 9A, the insulating layers 205 that cover the wiring layers 204 are formed on the insulating layers 202 with respect to both sides of the support 100. The insulating layers 205 can be formed by a method similar to the method of forming the insulating layers 202. Thereafter, the via holes 206 that penetrate the insulating layers 205 and that expose parts of the wiring layers 204 are formed on the insulating layers 205. The via holes 206 can be formed by a method similar to the method of forming the via holes 203. Subsequently, the wiring layers 207, which are connected to the wiring layers 204 through the via holes 206, are formed on the insulating layers 205. The wiring layers 207 can be formed by a method similar to the method of forming the wiring layers 204.

Then, as illustrated in FIG. 9B, with respect to both sides of the support 100, the solder resist layers 208 having the opening portions 209 are formed on the insulating layers 205. The solder resist layers 208 can be obtained, for example, by laminating a photosensitive resin film or by applying a liquid resin or a paste resin and exposing and developing the resin by photolithography to pattern it into a desired shape. Through the opening portions 209, parts of the upper surfaces of the wiring layers 207 are exposed as external connection terminals. In this manner, the wiring members 200 are obtained on both sides of the support 100.

Figure 10:
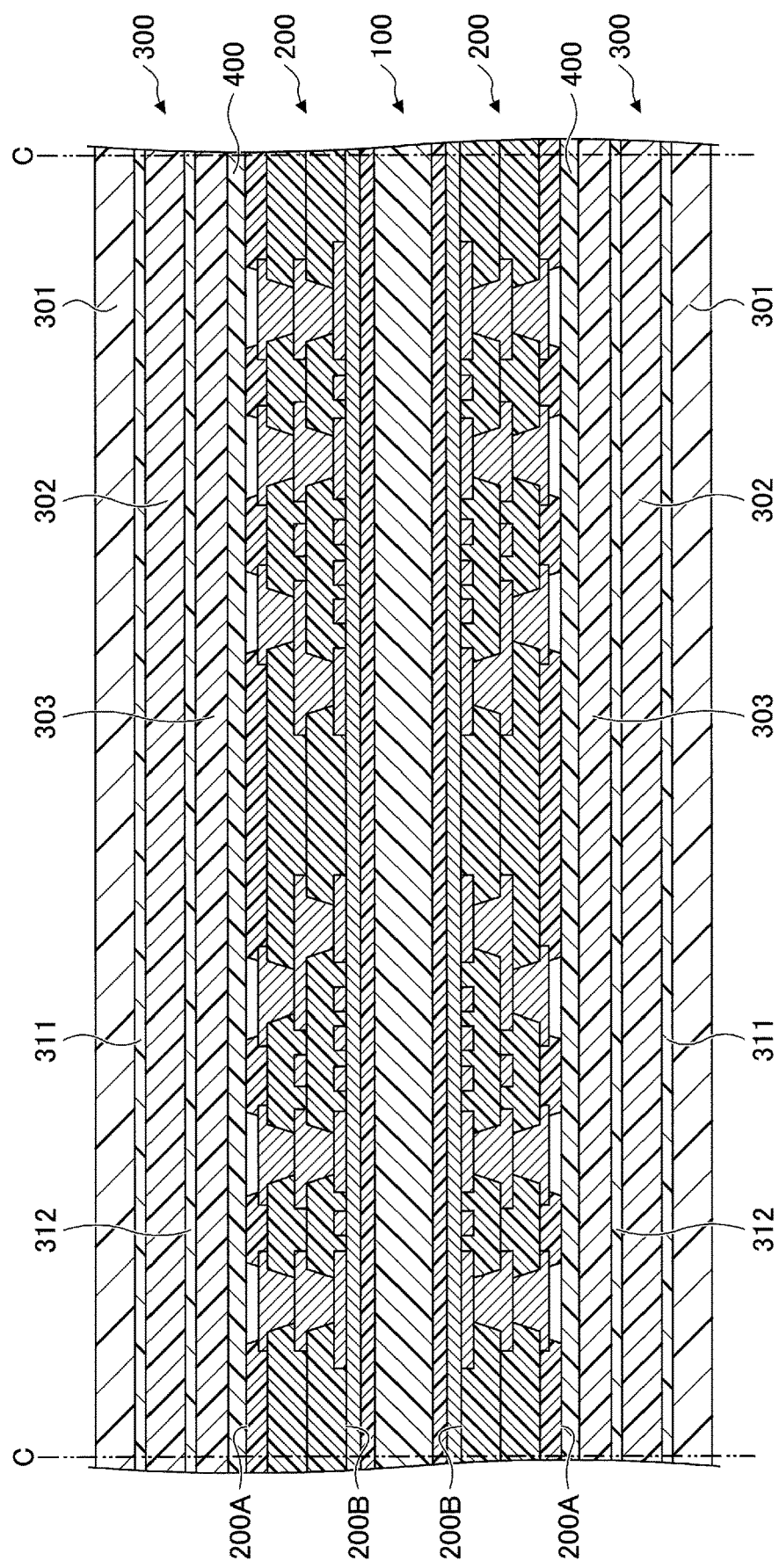
FIG. 10 is a diagram illustrating the method of manufacturing the wiring substrates according to the first embodiment (part 4)

Thereafter, as illustrated in FIG. 10, with respect to both sides of the support 100, the carriers 300, which are prepared in advance, are bonded to the first surfaces 200A of the wiring members 200 by the adhesives 400 so as to cover the entire surfaces of the solder resist layers 208. At this time, the carriers 300 adhere to the first surfaces 200A of the wiring members 200 such that the third layers 303 are in contact with the adhesives 400.

Figure 11:
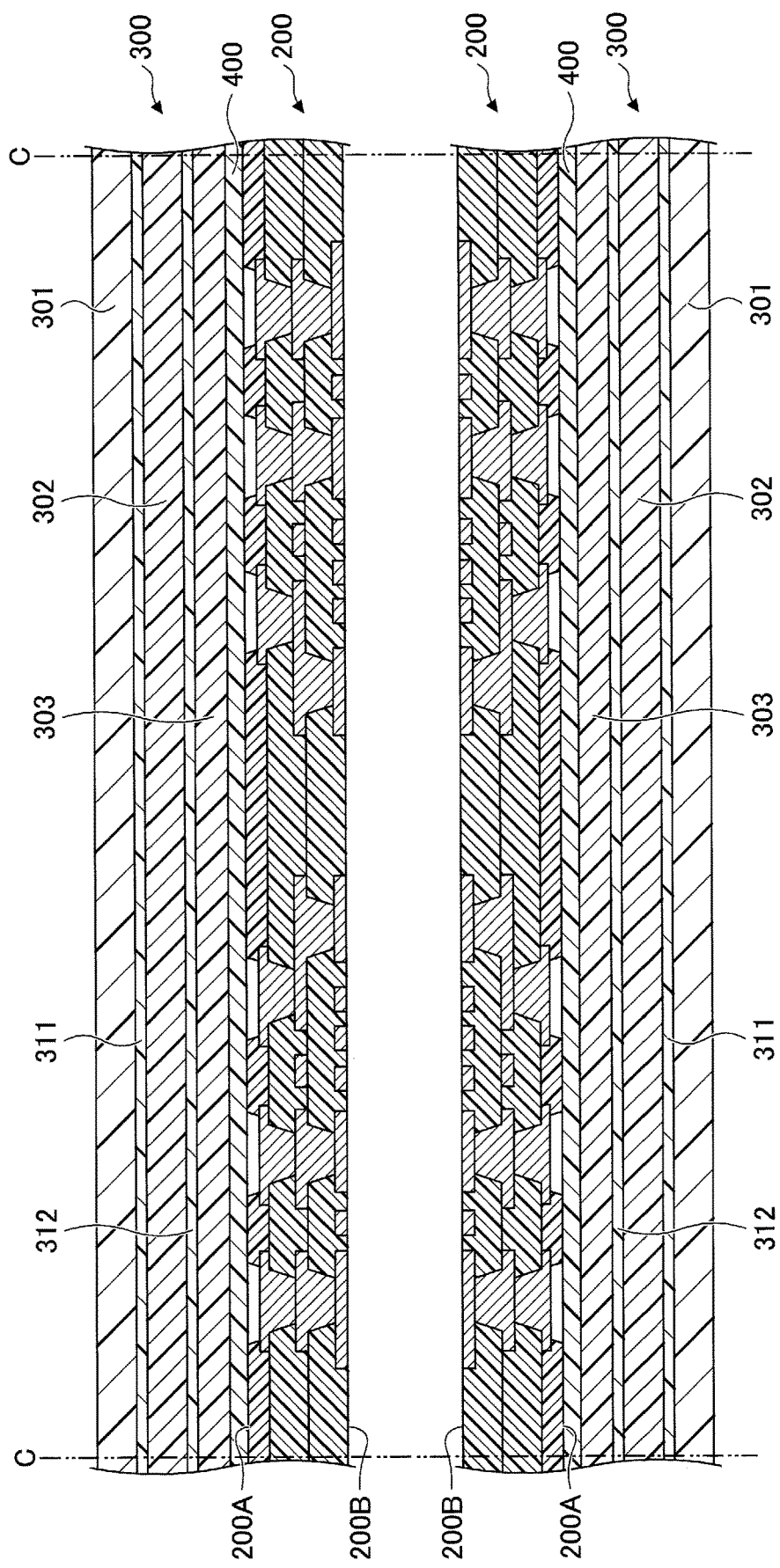
FIG. 11 is a diagram illustrating the method of manufacturing the wiring substrates according to the first embodiment (part 5)

Then, the wiring members 200 are separated from both sides of the support 100 as illustrated in FIG. 11.

Figure 12:
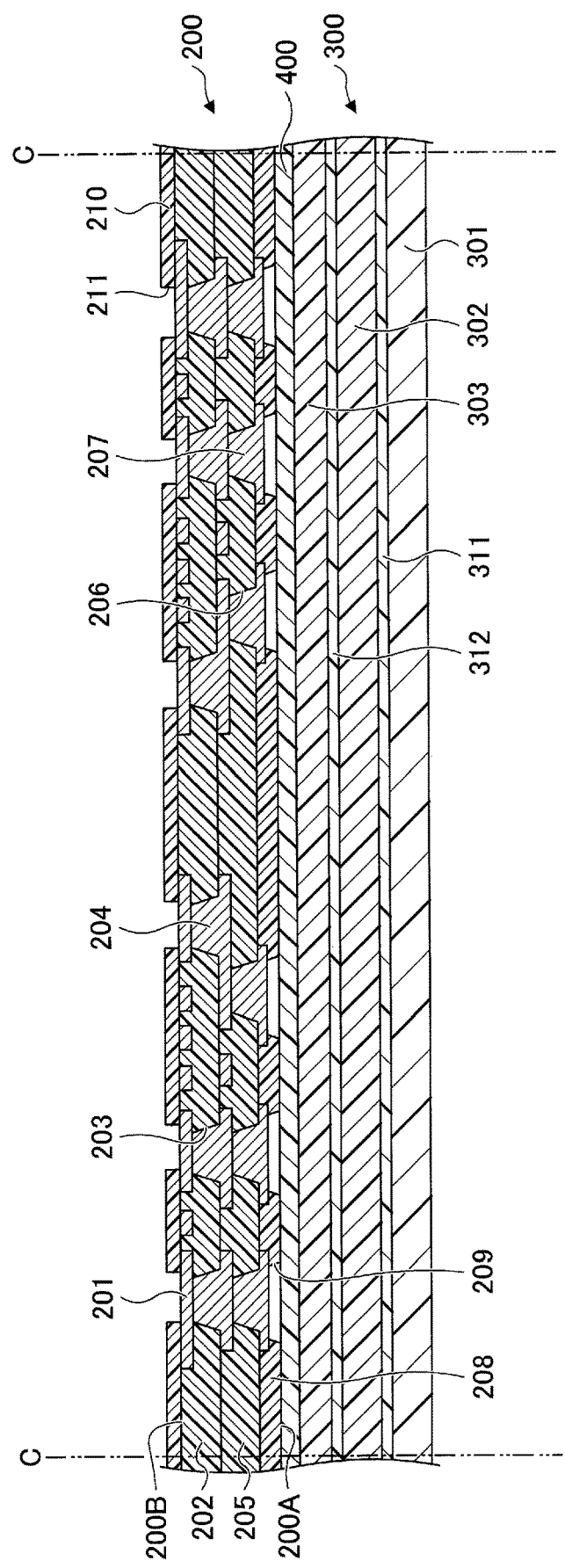
FIG. 12 is a diagram illustrating the method of manufacturing the wiring substrates according to the first embodiment (part 6)

Subsequently, as illustrated in FIG. 12, the solder resist layer 210 having the opening portions 211 is formed on the insulating layer 202. The solder resist layer 210 can be formed by a method similar to the method of forming the solder resist layers 208. Note that FIG. 12 illustrates only one of the wiring members 200.

Subsequently, the structure illustrated in FIG. 12 is cut by a slicer or the like along the double-dot chains lines D in FIG. 7. Thus, the structure illustrated in FIG. 12 is separated into pieces, and a plurality of wiring substrates 1 according to the first embodiment are obtained. In this manner, the wiring substrates 1 according to the first embodiment can be manufactured.

According to such a method, because the wiring layers 201 with a narrow pitch of wires are formed on the support 100 side prior to the wiring layers 207 with a wide pitch of wires, wiring substrates 1 suitable for mounting semiconductor chips with a narrow pitch of pads can be easily manufactured.

Note that it is preferable that the materials and the thicknesses of the first layer 301, the second layer 302, and the third layer 303 are selected as appropriate so as to prevent warpage of the wiring member 200, for example, through a simulation using a finite element method. Also, after the selection through the simulation, it is preferable to actually manufacture semiconductor packages by a method that will be described below, to feedback the results, and to use more suitable materials and thicknesses, and the like.

Second Embodiment

Next, a second embodiment will be described. The second embodiment relates to a method of manufacturing semiconductor packages using a wiring substrate 1 according to the first embodiment. FIG. 13 to FIG. 16 are diagrams illustrating the method of manufacturing the semiconductor packages according to the second embodiment.

Figure 13:
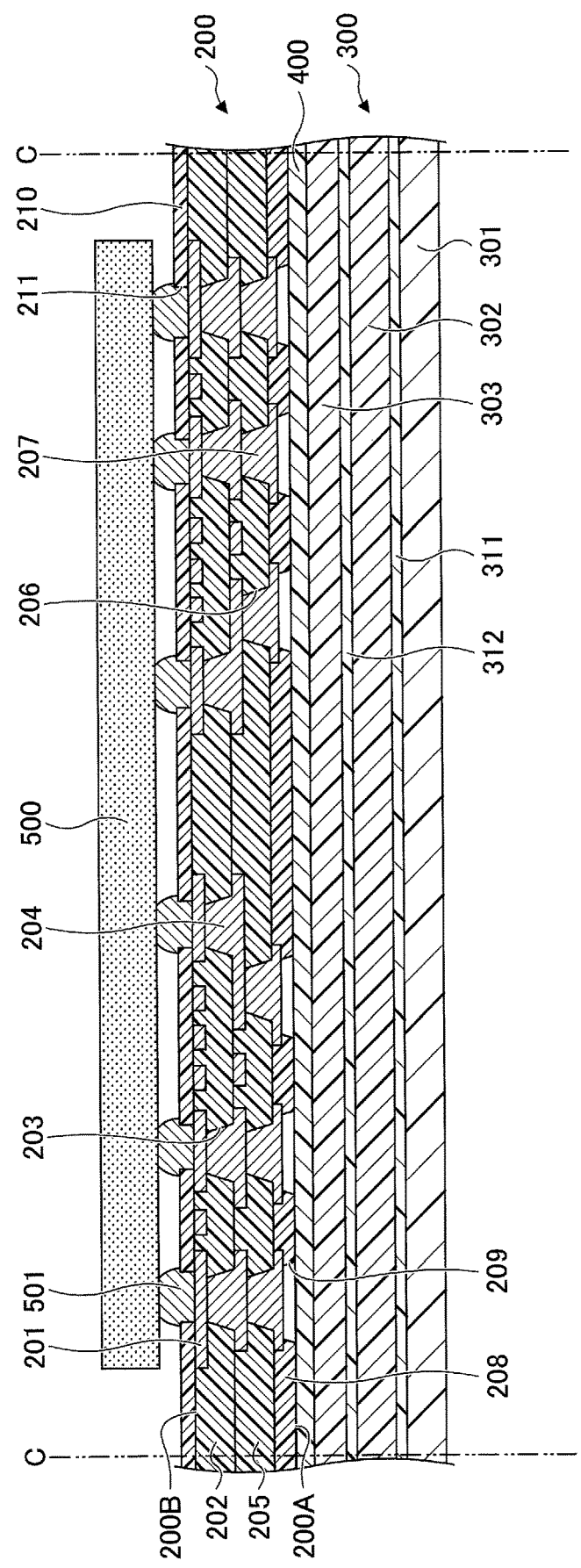
FIG. 13 is a diagram illustrating a method of manufacturing semiconductor packages according to a second embodiment (part 1)

In the second embodiment, semiconductor chips 500 are first flip-chip mounted on the wiring substrate 1 via bumps 501, as illustrated in FIG. 13. Specifically, by reflow, the wiring layer 207 exposed from the opening portions 211 of the wiring substrate 1 and pads (not illustrated) of the semiconductor chips 500 are joined through the bumps 501. For example, a solder ball or the like may be used as the bumps 501. As a material of the solder ball, for example, an alloy such as an alloy containing Pb, an alloy of Sn and Cu, an alloy of Sn and Sb, an alloy of Sn and Ag, an alloy of Sn and Ag, or an alloy of Ag and Cu may be used. Note that a gap between the semiconductor chips 500 and the wiring member 200 may be filled with an underfill resin. The temperature of the reflow is, for example, in a range of from 200° C. to 250° C. As the temperature rises during reflow, the wiring member 200 tends to warp in a convex shape and the carrier 300 tends to warp in a concave shape. Because the directions in which warpage tends to occur are opposite the warpage of the entire substrate 1 is suppressed. Also, as the temperature drops after the reflow, the wiring member 200 and the carrier 300 tend to return to a flat shape. At this time, because the direction in which the wiring member 200 tends to warp and the direction in which the carrier 300 tends to warp are also opposite, the warpage of the entire wiring substrate 1 is suppressed. Accordingly, thermal deformation of the wiring substrate 1 during the reflow process is suppressed.

Figure 14:
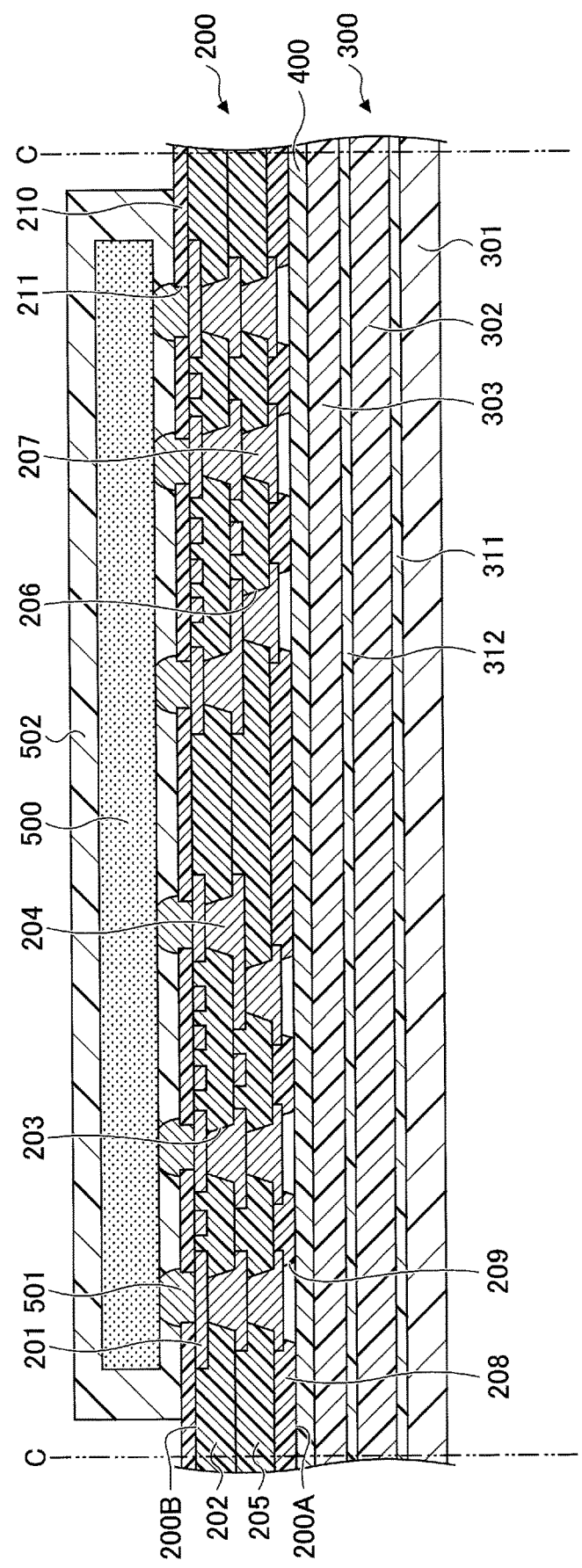
FIG. 14 is a diagram illustrating the method of manufacturing the semiconductor packages according to the second embodiment (part 2)

Thereafter, similarly to the second embodiment, as illustrated in FIG. 14, sealing resins 502 that seal the semiconductor chips 500 and the bumps 501 are formed by a transfer mold method using a sealing mold or the like. As the sealing resins 502, an insulating resin (which may be referred to as a mold resin) such as a thermosetting epoxy resin containing a filler, for example, can be used. The sealing resins 502 are then heated to harden. The heating temperature at this time is, for example, between 130° C. and 170° C. During this heating, as the temperature rises, the wiring member 200 tends to warp in a convex shape and the carrier 300 tends to warp in a concave shape. Thus, because the directions in which warpage tends to occur are opposite, the warpage of the entire wiring substrate 1 is suppressed. Also, as the temperature drops after the heating, the wiring member 200 and the carrier 300 tend to return to a flat shape. At this time also, because the direction in which the wiring member 200 tends to warp and the direction in which the carrier 300 tends to warp are also opposite, the warpage of the entire wiring substrate 1 is suppressed. Accordingly, thermal deformation of the wiring substrate 1 during the sealing resin formation process is suppressed.

Figure 15:
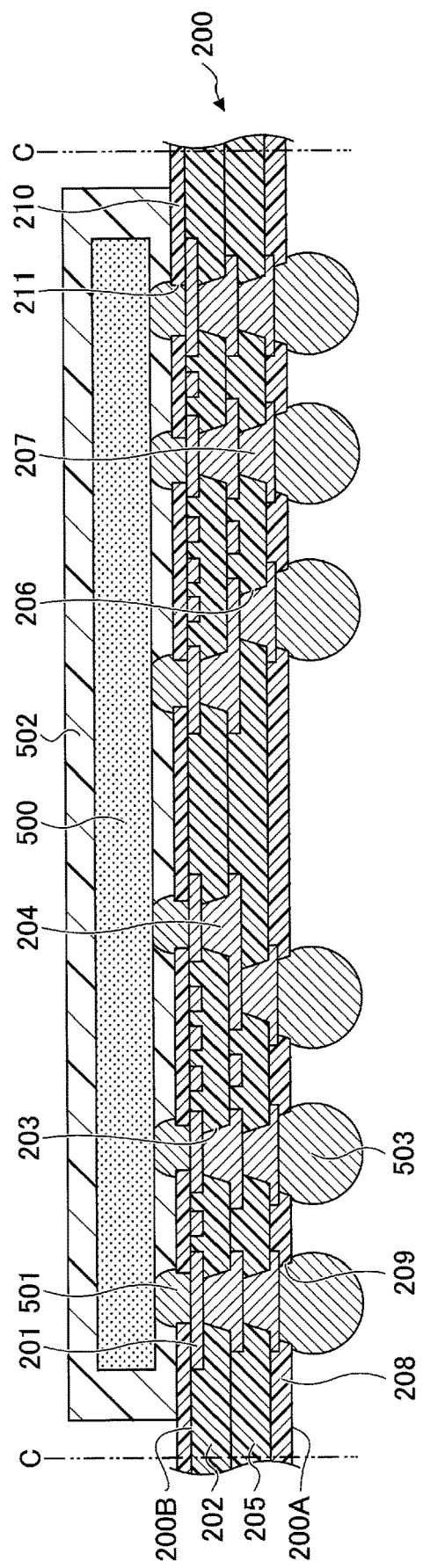
FIG. 15 is a diagram illustrating the method of manufacturing the semiconductor packages according to the second embodiment (part 3)

Thereafter, as illustrated in FIG. 15, the carrier 300 is peeled off from the wiring member 200. Subsequently, bumps 503 are formed on the lower surface of the wiring layer 207. For example, a solder ball or the like may be used as the bumps 503. As a material of the solder ball, for example, an alloy such as an alloy containing Pb, an alloy of Sn and Cu, an alloy of Sn and Sb, an alloy of Sn and Ag, an alloy of Sn and Ag, or an alloy of Ag and Cu may be used.

Figure 16:
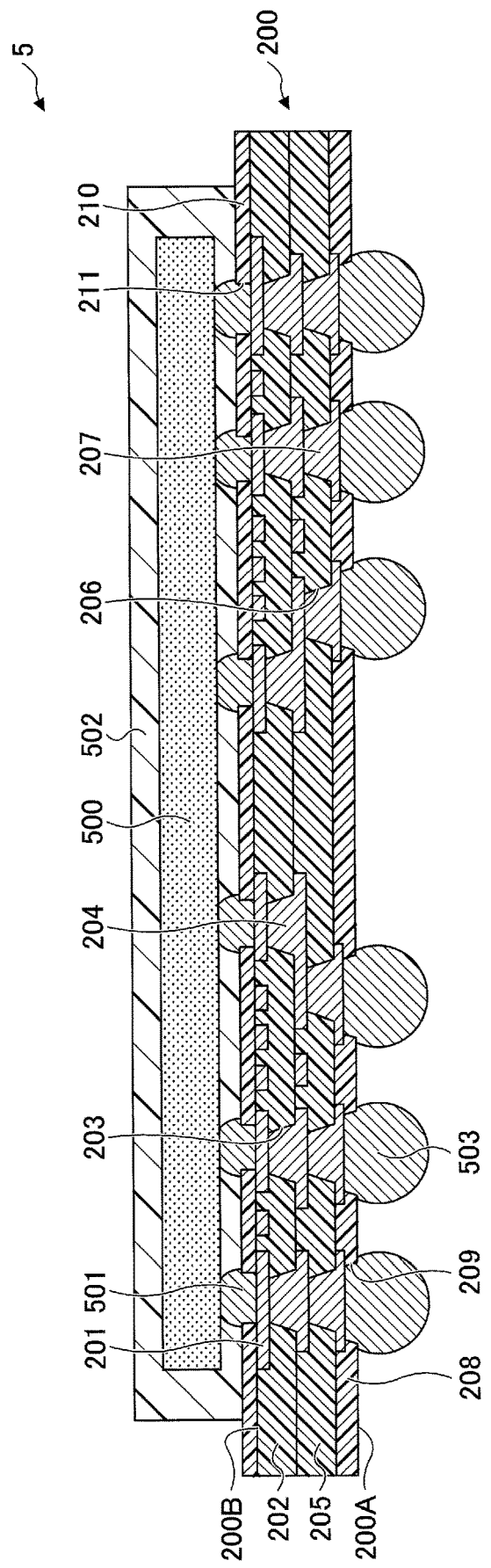
FIG. 16 is a diagram illustrating the method of manufacturing the semiconductor packages according to the second embodiment (part 4)

Subsequently, as illustrated in FIG. 16, the structure illustrated in FIG. 15 is cut by a slicer or the like along the double-dot chains lines C. Thus, the structure illustrated in FIG. 15 is separated into pieces, and a plurality of semiconductor packages 5 are obtained. In this manner, the semiconductor packages 5 can be manufactured.

Third Embodiment

Next, a third embodiment will be described. The third embodiment relates to a method of manufacturing semiconductor packages using a wiring substrate 1 according to the first embodiment. FIG. 17 to FIG. 20 are diagrams illustrating the method of manufacturing the semiconductor packages according to the third embodiment.

Figure 17:
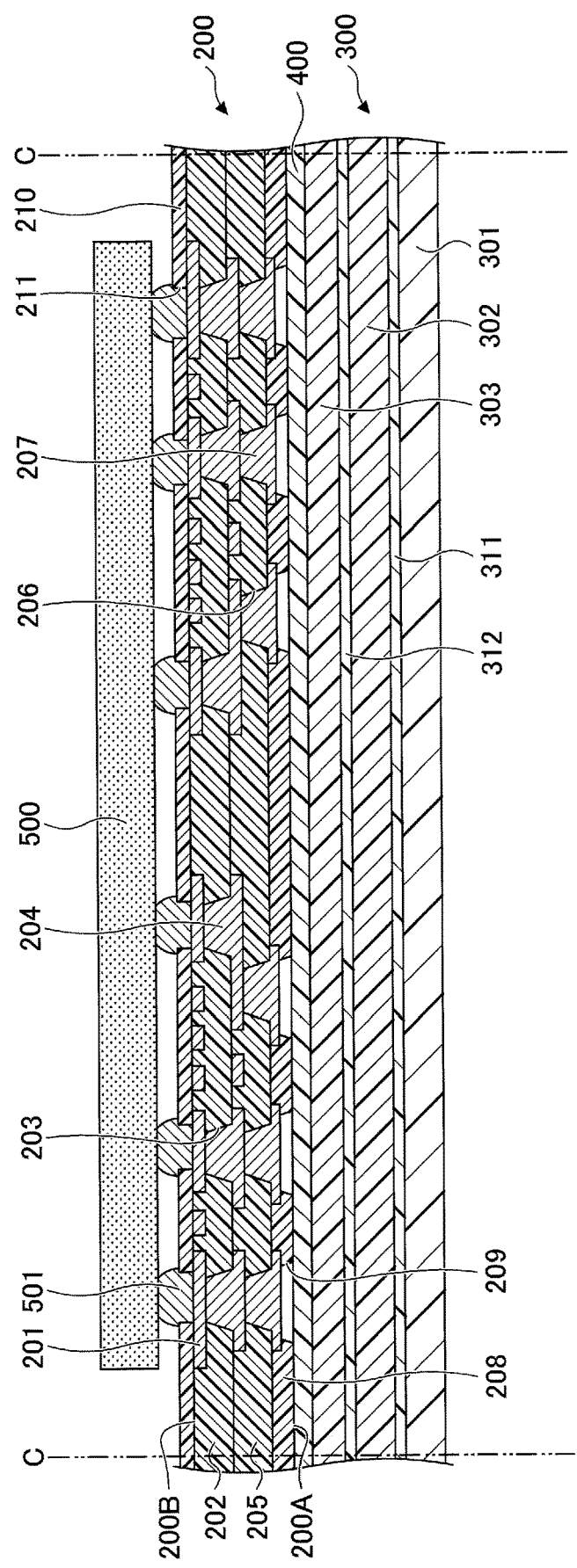
FIG. 17 is a diagram illustrating a method of manufacturing semiconductor packages according to a third embodiment (part 1)

In the third embodiment, similarly to the second embodiment, the semiconductor chips 500 are first flip-chip mounted on the wiring substrate 1 via the bumps 501, as illustrated in FIG. 17. Specifically, by reflow, the wiring layer 207 exposed from the opening portions 211 of the wiring substrate 1 and pads (not illustrated) of the semiconductor chips 500 are joined through the bumps 501. Similarly to the second embodiment, thermal deformation of the wiring substrate 1 during the reflow process is suppressed.

Figure 18:
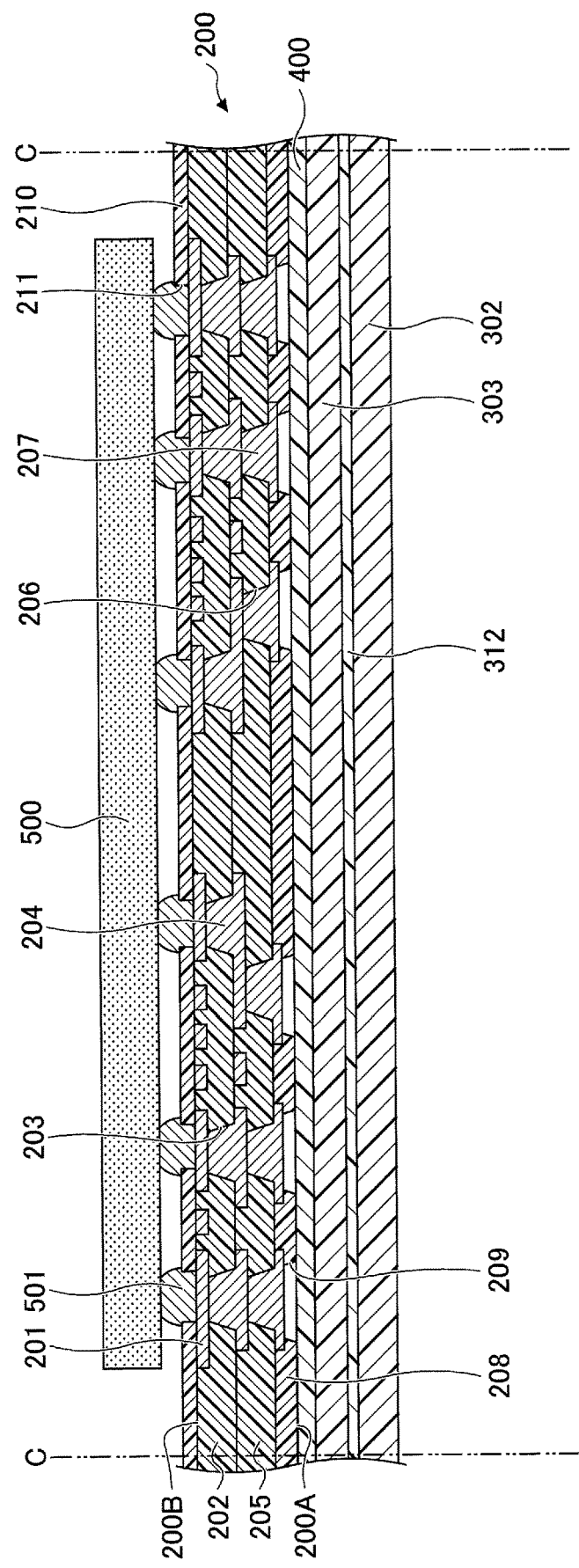
FIG. 18 is a diagram illustrating the method of manufacturing the semiconductor packages according to the third embodiment (part 2)

The first layer 301 is then peeled off from the second layer 302 together with the adhesive 311, as illustrated in FIG. 18.

Figure 19:
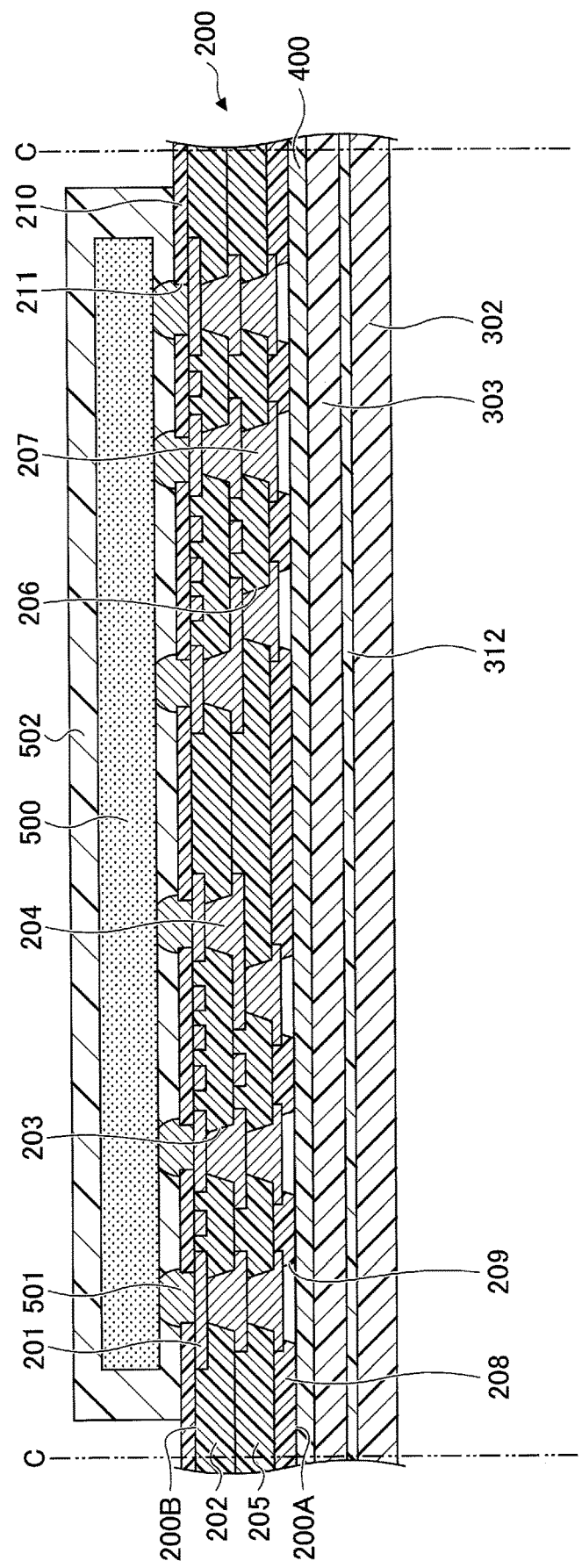
FIG. 19 is a diagram illustrating the method of manufacturing the semiconductor packages according to the third embodiment (part 3)

Thereafter, similarly to the second embodiment, as illustrated in FIG. 19, the sealing resins 502 that seal the semiconductor chips 500 and the bumps 501 are formed by a transfer mold method using a sealing mold or the like. As the sealing resins 502, an insulating resin (which may be referred to as a mold resin) such as a thermosetting epoxy resin containing a filler, for example, can be used. The sealing resins 502 are then heated to harden. The heating temperature at this time is, for example, between 130° C. and 170° C.

Figure 20:
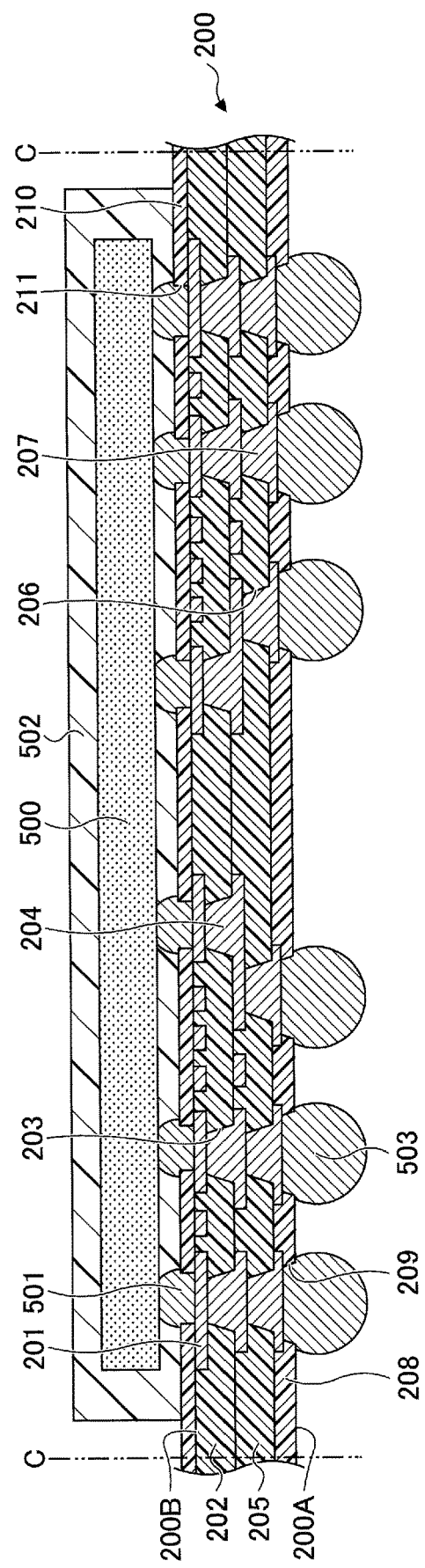
FIG. 20 is a diagram illustrating the method of manufacturing the semiconductor packages according to the third embodiment (part 4)

Thereafter, as illustrated in FIG. 20, the carrier 300 is peeled off from the wiring member 200. Subsequently, the bumps 503 are formed on the lower surface of the wiring layer 207. The structure illustrated in FIG. 20 is cut by a slicer or the like along the double-dot chains lines C. Thus, the structure illustrated in FIG. 20 is separated into pieces, and a plurality of semiconductor packages 5 are obtained. In this manner, the semiconductor packages 5 can be manufactured.

After mounting the semiconductor chips 500, thermal deformation of the wiring member 200 may be restrained by the semiconductor chips 500. Accordingly, depending on the restraint strength from the semiconductor chips 500, the thermal deformation of the first layer 301 may be excessive with respect to the restraint of the thermal deformation of the wiring member 200. In the present embodiment, because the first layer 301 is peeled off prior to a heating process to harden the sealing resins 502, the thermal deformation of the wiring member 200 can be suppressed in an appropriate balance. Note that depending on the restraint strength from the semiconductor chips 500, not only the first layer 301 but also the second layer 302 may be peeled off.

Fourth Embodiment

Next, a fourth embodiment will be described. The fourth embodiment relates to a wiring substrate.

[Structure of Wiring Substrate]

Figure 21:
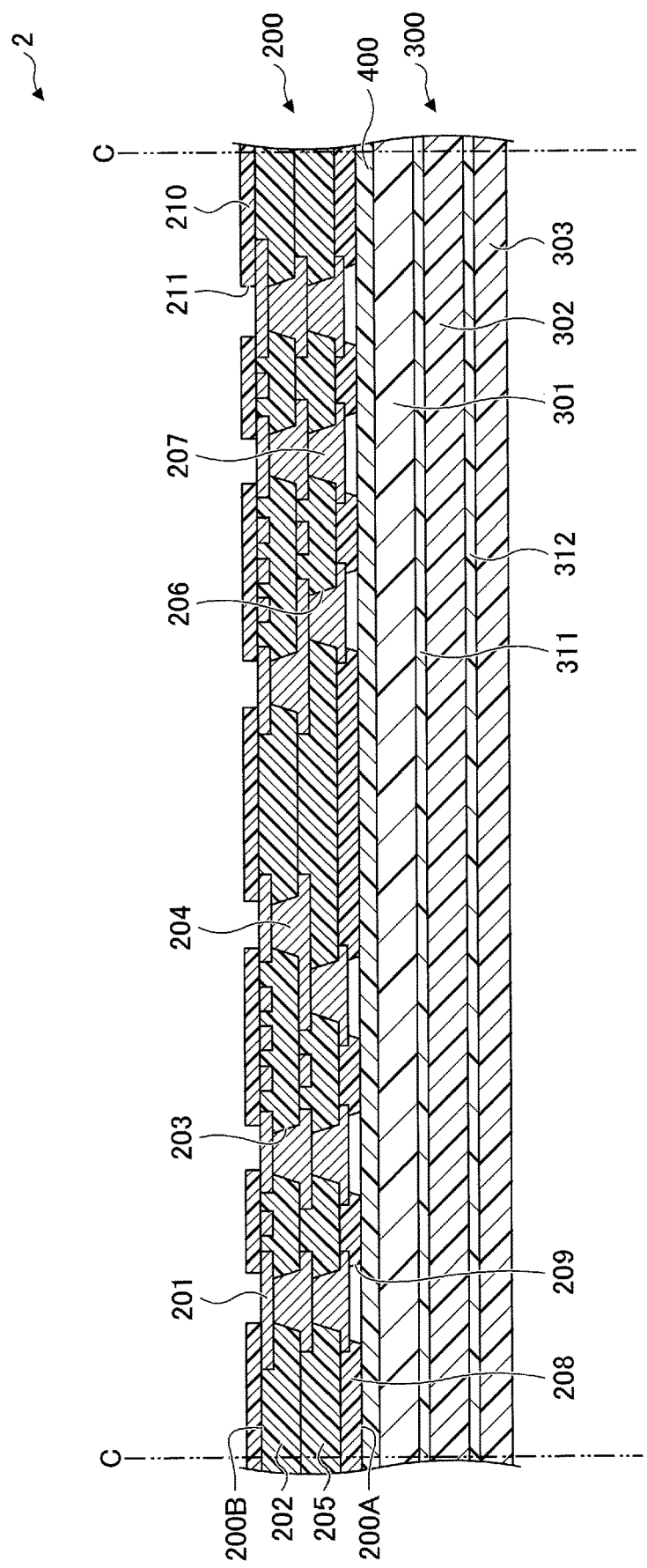
FIG. 21 is a cross-sectional view illustrating a structure of a wiring substrate according to a fourth embodiment.

First, a structure of a wiring substrate 2 will be described. FIG. 21 is a cross-sectional view illustrating the structure of the wiring substrate 2 according to the fourth embodiment.

With respect to the wiring substrate 2 according to the fourth embodiment, when the wiring member 200 is heated, the first surface 200A is thermally expanded larger than the second surface 200B. That is, by being heated, the wiring member 200 is thermally deformed into a concave shape. The manner of thermal deformation of the wiring member 200 depends on elements such as the materials and the thicknesses of the wiring layers 201, 204 and 207 and the materials and the thicknesses of the insulating layers 202 and 205, and, for example, differs from the first embodiment in at least one of these elements.

Also, as illustrated in FIG. 21, the configuration of the carrier 300 itself is similar to that of the first embodiment, but in the wiring substrate 2, the first layer 301 is bonded to the first surface 200A by the adhesive 400. That is, assuming that the wiring member 200 is above the carrier 300, the carrier 300 includes the third layer 303, the second layer 302 above the third layer 303, and the first layer 301 above the second layer 302. The first layer 301 and the second layer 302 are bonded to each other by the adhesive 311, and the second layer 302 and the third layer 303 are bonded to each other by the adhesive 312. The coefficient of thermal expansion of the second layer 302 is lower than the coefficient of thermal expansion of the first layer 301, and the coefficient of thermal expansion of the third layer 303 is lower than the coefficient of thermal expansion of the second layer 302. For example, the coefficient of thermal expansion of the first layer 301 is in a range of from 24 ppm/° C. to 29 ppm/° C., the coefficient of thermal expansion of the second layer 302 is in a range of from 20 ppm/° C. to 23 ppm/° C., and the coefficient of thermal expansion of the third layer 303 is in a range of from 15 ppm/° C. to 19 ppm/° C.

Other configurations of the fourth embodiment are similar to those of the first embodiment.

Figure 22A:
FIGS. 22A to 22C are schematic vies illustrating an example of thermal deformation of the wiring substrate according to the fourth embodiment.
Figure 22B:
Figure 22C:

Next, thermal deformation of the wiring substrate 2 according to the fourth embodiment will be described. FIGS. 22A to 22C are schematic views illustrating an example of thermal deformation of the wiring substrate 2 according to the fourth embodiment.

In the present embodiment, as illustrated in FIG. 22A, upon being heated, the wiring member 200 tends to be thermally deformed into a concave shape. Accordingly, as illustrated in FIG. 22B, upon being heated, the carrier 300 tends to be thermally deformed into a convex shape. That is, when being heated, the direction in which the wiring member 200 tends to warp and the direction in which the carrier 300 tends to warp are opposite. Also, the wiring member 200 is bonded to the carrier 300 by the adhesive 400. Therefore, thermal deformation of the wiring member 200 and thermal deformation of the carrier 300 are restrained each other, the warpage of the wiring member 200 and the warpage of the carrier 300 are canceled out each other, and the warpage of the wiring substrate 2 is significantly suppressed, as illustrated in FIG. 22C. Because the warpage of the wiring substrate 2 is suppressed, the warpage of the wiring member 200 is also suppressed. Also, as the temperature drops after the heating, the wiring member 200 and the carrier 300 tend to return to a flat shape. At this time, because the direction in which the wiring member 200 tends to warp and the direction in which the carrier 300 tends to warp are also opposite, the warpage of the entire wiring substrate 2 is suppressed.

In this manner, according to the present embodiment, the warpage of the wiring member 200 due to heat can be remarkably suppressed. Accordingly, similarly to the first embodiment, semiconductor chips can be precisely aligned during a process of manufacturing semiconductor packages. Also, it is possible to reduce or prevent conveyance failure and appearance failure due to warpage of the wiring substrate 2.

[Method of Manufacturing Wiring Substrates]

Figure 24:
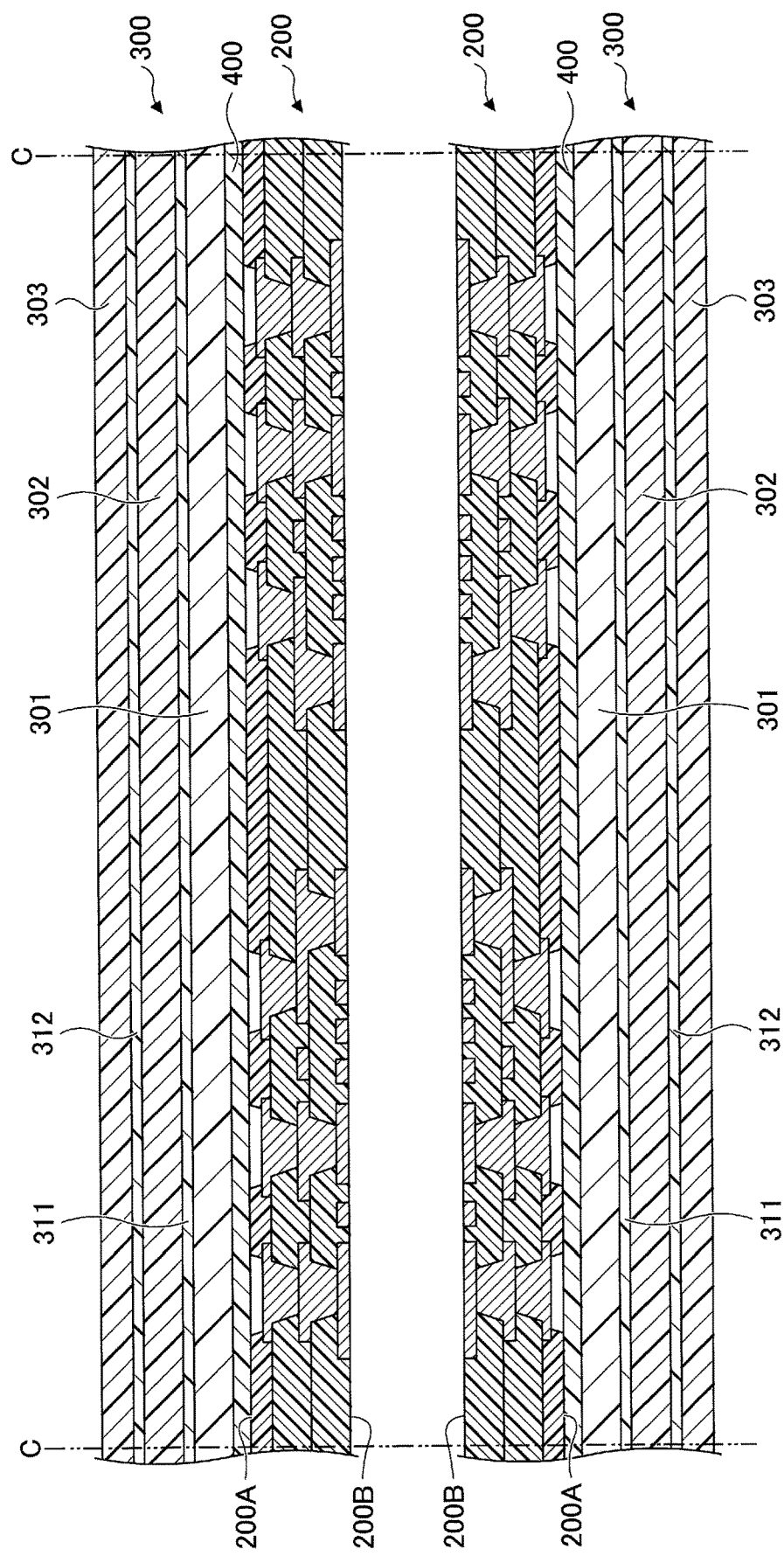
FIG. 24 is a diagram illustrating the method of manufacturing the wiring substrates according to the fourth embodiment (part 2)
Figure 25:
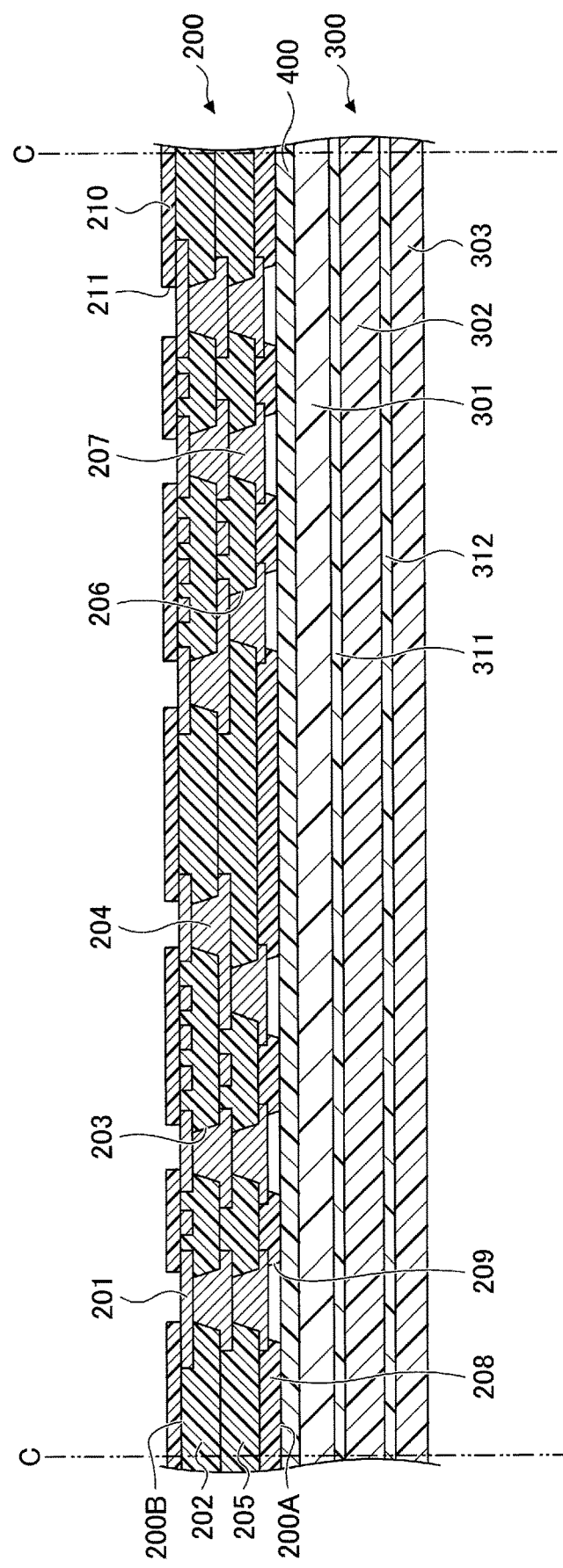
FIG. 25 is a diagram illustrating the method of manufacturing the wiring substrates according to the fourth embodiment (part 3).

Next, a method of manufacturing wiring substrates 2 will be described. FIG. 23 to FIG. 25 are diagrams illustrating the method of manufacturing the wiring substrates 2 according to the fourth embodiment.

First, similarly to the first embodiment, the support 100 is provided, and the wiring members 200 are formed on both sides of the support 100 (see FIG. 9B). Thereafter, as illustrated in FIG. 23, with respect to both sides of the support 100, the carriers 300, which are prepared in advance, are bonded to the first surfaces 200A of the wiring members 200 by the adhesives 400 so as to cover the entire surfaces of the solder resist layers 208. At this time, the carriers 300 adhere to the first surfaces 200A of the wiring members 200 such that the third layers 303 are in contact with the adhesives 400.

Thereafter, as illustrated in FIG. 24, the wiring members 200 are separated from both sides of the support 100.

Subsequently, as illustrated in FIG. 25, the solder resist layer 210 having the opening portions 211 is formed on the insulating layer 202. The solder resist layer 210 can be foamed by a method similar to the method of forming the solder resist layers 208. Note that FIG. 25 illustrates only one of the wiring members 200.

Subsequently, the structure illustrated in FIG. 25 is cut by a slicer or the like along the double-dot chains lines D in FIG. 7. Thus, the structure illustrated in FIG. 25 is separated into pieces, and a plurality of wiring substrates 2 according to the fourth embodiment are obtained. In this manner, the wiring substrates 2 according to the fourth embodiment can be manufactured.

According to such a method, because the wiring layers 201 with a narrow pitch of wires are formed on the support 100 side prior to the wiring layers 207 with a wide pitch of wires, wiring substrates 2 suitable for mounting semiconductor chips with a narrow pitch of pads can be easily manufactured.

By a method similar to that of the second or third embodiment, semiconductor packages can be manufactured by using the wiring substrate 2. In this case, warpage can also be suppressed.

Note that the number of layers included in a carrier is not limited to three, and may be two or four or more. In a case where the number of layers included in a carrier is three or more, it is preferable that in accordance with the direction in which a wiring member tends to warp, the coefficient of thermal expansion decreases or increases with decreasing distance to the wiring member.

Also, in these embodiments, a flat wiring substrate is obtained by the warpage of a wiring member and the warpage of a carriers being canceled out each other. Therefore, for the carrier, delicate control of the coefficient of thermal expansion is needed. If the number of layers contained in the carrier is one or two, the amount of warping is required to be adjusted by adjusting the material and the thickness of each layer, and it is difficult to control to cancel the warpage of a wiring member. However, in a case where the number of layers contained in the carrier is three or more, because the coefficient of thermal expansion (material) and the thickness of the intermediate layer can be adjusted, the coefficient of thermal expansion can be delicately controlled to cancel out the warpage of the wiring member.

Various aspects of the subject-matter described herein may be set out non-exhaustively in the following numbered clauses:

1. A method of manufacturing a wiring substrate, the method comprising:
    forming, on a support, a wiring member including a first surface and a second surface such that the second surface is toward the support, the wiring member including a plurality of wiring layers between the first surface and the second surface;
    bonding a carrier to the first surface via an adhesive, the carrier including a plurality of layers whose coefficients of thermal expansion are different from each other; and
    separating the wiring member from the support;
    wherein a pitch of wires included in the plurality of wiring layers is narrower on the second side than on the first side, and
    wherein, when being heated, a direction in which the wiring member tends to warp and a direction in which the carrier tends to warp are opposite.

2. The method of clause 1, further comprising:
    mounting a semiconductor chip on the wiring member;
    sealing the semiconductor chip; and
    peeling off the carrier from the wiring member after sealing the semiconductor chip.

3. The method of clause 2, further comprising:
    between the mounting the semiconductor chip and the sealing the semiconductor chip, peeling off part of the layers included in the carrier.

Although the preferred embodiments and the like have been described above in detail, the present invention is not limited to the embodiments and the like described above, and various variations and substitutions may be made for the embodiments and the like described above without departing from the scope of the present invention.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A wiring substrate comprising:
    a wiring member that includes a first surface and a second surface, the wiring member including a plurality of wiring layers between the first surface and the second surface; and
    a carrier that is bonded to the first surface via a first adhesive and that includes a plurality of layers whose coefficients of thermal expansion are different from each other, and one or more second adhesives,
    wherein the carrier has a configuration in which the plurality of layers and the one or more second adhesives are alternately layered,
    wherein a pitch of wires included in the plurality of wiring layers is narrower on the second surface side than on the first surface side, and
    wherein, with respect to the layers included in the carrier, the coefficients of thermal expansion decrease in accordance with proximity to the wiring member such that when being heated, a direction in which the wiring member tends to warp and a direction in which the carrier tends to warp are opposite.

2. The wiring substrate according to claim 1, wherein, when being heated, the wiring member tends to warp in a convex shape on the carrier.

3. The wiring substrate according to claim 1, wherein a number of layers included in the carrier is three or more.

4. The wiring substrate according to claim 1, wherein a strength of adhesion of the second adhesives is lower than that of the first adhesive.

5. A wiring substrate comprising:
    a wiring member that includes a first surface and a second surface, the wiring member including a plurality of wiring layers between the first surface and the second surface;
    a carrier that is bonded to the first surface via a first adhesive and that includes a plurality of layers whose coefficients of thermal expansion are different from each other, and one or more second adhesives,
    wherein the carrier has a configuration in which the plurality of layers and the one or more second adhesives are alternately layered, wherein a pitch of wires included in the plurality of wiring layers is narrower on the second surface side than on the first surface side, and wherein with respect to the layers included in the carrier, the coefficients of thermal expansion increase in accordance with proximity to the wiring member such that when being heated, a direction in which the wiring member tends to warp and a direction in which the carrier tends to warp are opposite.

6. The wiring substrate according to claim 5, wherein, when being heated, the wiring member tends to warp in a concave shape on the carrier.

7. The wiring substrate according to claim 5, wherein a number of layers included in the carrier is three or more.

8. The wiring substrate according to claim 5, wherein a strength of adhesion of the second adhesives is lower than that of the first adhesive.

* * * * *